(12) United States Patent
Maejima et al.

(10) Patent No.: US 10,672,487 B2
(45) Date of Patent: Jun. 2, 2020

(54) SEMICONDUCTOR MEMORY DEVICE

(71) Applicant: Toshiba Memory Corporation, Tokyo (JP)

(72) Inventors: Hiroshi Maejima, Setagaya Tokyo (JP);
Koji Hosono, Fujisawa Kanagawa (JP);
Tadashi Yasufuku, Kawasaki Kanagawa (JP); Noboru Shibata, Kawasaki Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 16/459,528

(22) Filed: Jul. 1, 2019

(65) Prior Publication Data
US 2019/0325973 A1    Oct. 24, 2019

Related U.S. Application Data

(62) Division of application No. 15/987,810, filed on May 23, 2018, now Pat. No. 10,381,096, which is a
(Continued)

(30) Foreign Application Priority Data

Dec. 17, 2015 (JP) ................................ 2015-246749

(51) Int. Cl.
*G11C 11/34*     (2006.01)
*G11C 16/34*     (2006.01)
(Continued)

(52) U.S. Cl.
CPC ...... *G11C 16/3459* (2013.01); *G11C 11/5628* (2013.01); *G11C 11/5642* (2013.01); *G11C 16/0483* (2013.01); *G11C 2211/5621* (2013.01)

(58) Field of Classification Search
CPC ............ G11C 16/3459; G11C 11/5628; G11C 11/5642; G11C 16/0483; G11C 2211/5621
(Continued)

(56) References Cited

U.S. PATENT DOCUMENTS 5,969,885 A * 10/1999 Harder ................. G01N 21/274
                                                         359/811
6,122,193 A     9/2000 Shibata et al.
(Continued)

FOREIGN PATENT DOCUMENTS

JP      2011-150749 A    8/2011

OTHER PUBLICATIONS

Taiwanese Office Action dated Dec. 19, 2017 in related Taiwan Patent Application 105121269 with English Translation, 11 pages.
(Continued)

*Primary Examiner* — Viet Q Nguyen
(74) *Attorney, Agent, or Firm* — Kim & Stewart LLP

(57) ABSTRACT

A semiconductor memory device includes first and second memory cells, each of which includes a charge storage layer, a first bit line that is connected to the first memory cell, and a second bit line that is connected to the second memory cell. A writing operation includes multiple loops of a programming operation and a verification operation, and first data is written in the first memory cell, and second data different from the first data is written in the second memory cell through the writing operation. In a first loop of the writing operation, a first voltage is applied to the first bit line and the second bit line is maintained in an electrically floating state during the programming operation, and a verification operation relating to the second data is not performed and a verification operation relating to the first data is performed.

6 Claims, 27 Drawing Sheets

Related U.S. Application Data division of application No. 15/233,658, filed on Aug. 10, 2016, now Pat. No. 9,984,761.

(51) Int. Cl.
  *G11C 11/56* (2006.01)
  *G11C 16/04* (2006.01)

(58) Field of Classification Search
  USPC .................................................. 365/185.03
  See application file for complete search history.

(56) References Cited

U.S. PATENT DOCUMENTS

| | | | |
|---|---|---|---|
| 6,222,762 B1 | 4/2001 | Guterman et al. | |
| 6,243,295 B1* | 6/2001 | Satoh | G11C 16/0483 257/E21.69 |
| 6,373,746 B1 | 4/2002 | Takeuchi et al. | |
| 6,907,497 B2 | 6/2005 | Hosono et al. | |
| 6,937,510 B2 | 8/2005 | Hosono et al. | |
| 7,400,534 B2 | 7/2008 | Maejima | |
| 7,719,902 B2 | 5/2010 | Dong et al. | |
| 7,813,170 B2 | 10/2010 | Shibata | |
| 8,325,545 B2 | 12/2012 | Edahiro | |
| 8,339,857 B2 | 12/2012 | Edahiro | |
| 8,426,306 B1 | 4/2013 | Gee et al. | |
| 8,559,620 B2 | 10/2013 | Won et al. | |
| 8,902,654 B2 | 12/2014 | Maejima et al. | |
| 8,902,659 B2 | 12/2014 | Chan | |
| 9,251,903 B2 | 2/2016 | Kobayashi et al. | |
| 9,318,204 B1 | 4/2016 | Chen et al. | |
| 9,443,860 B1 | 9/2016 | Sung | |
| 9,570,180 B2 | 2/2017 | Maejima | |
| 9,613,713 B2 | 4/2017 | Shirakawa et al. | |
| 9,627,046 B2 | 4/2017 | Louie et al. | |
| 9,659,663 B2 | 5/2017 | Shirakawa et al. | |
| 9,984,761 B2 | 5/2018 | Maejima et al. | |
| 10,037,813 B2 | 7/2018 | Maejima et al. | |
| 2002/0118569 A1 | 8/2002 | Jeong et al. | |
| 2004/0041200 A1 | 3/2004 | Yoon | |
| 2004/0100826 A1 | 5/2004 | Cho | |
| 2005/0057965 A1 | 3/2005 | Cernea et al. | |
| 2005/0207229 A1* | 9/2005 | Takeuchi | G11C 8/08 365/185.25 |
| 2005/0265109 A1* | 12/2005 | Goda | G11C 8/10 365/230.06 |
| 2006/0256618 A1* | 11/2006 | Nazarian | G11C 16/0483 365/185.17 |
| 2007/0058417 A1 | 3/2007 | Roehr | |
| 2008/0253190 A1 | 10/2008 | Jeon et al. | |
| 2009/0086542 A1* | 4/2009 | Lee | G11C 11/5628 365/185.17 |
| 2009/0268525 A1* | 10/2009 | Ueda | G11C 16/0491 365/185.18 |
| 2011/0122702 A1 | 5/2011 | Li | |
| 2012/0081963 A1 | 4/2012 | Dutta et al. | |
| 2012/0257455 A1 | 10/2012 | Oh et al. | |
| 2012/0307563 A1 | 12/2012 | Tailliet | |
| 2013/0128667 A1* | 5/2013 | Lee | G11C 16/10 365/185.11 |
| 2015/0146485 A1 | 5/2015 | Kim et al. | |
| 2016/0049192 A1* | 2/2016 | Lee | G11C 16/3427 365/185.03 |
| 2016/0225454 A1 | 8/2016 | Kim | |
| 2016/0300621 A1 | 10/2016 | Abe et al. | |
| 2017/0154677 A1 | 6/2017 | Lim et al. | |
| 2017/0178739 A1 | 6/2017 | Maejima et al. | |
| 2018/0247695 A1 | 8/2018 | Kasai et al. | |

OTHER PUBLICATIONS

Taiwanese Office Action dated Aug. 2, 2017 in related Taiwan Patent Application 105121269 with English Translation, 14 pages.

\* cited by examiner

FIG. 7

| THE NUMBER OF LOOPS / VERIFICATION TARGET LEVEL | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" LEVEL(VfyA) | ○ | ○ | ○ | ○ | ○ | ○ | | | | | | | | | | | | | |
| "B" LEVEL(VfyB) | | | ○ | ○ | ○ | ○ | ○ | ○ | | | | | | | | | | | |
| "C" LEVEL(VfyC) | | | | | ○ | ○ | ○ | ○ | ○ | ○ | | | | | | | | | |
| "D" LEVEL(VfyD) | | | | | | | ○ | ○ | ○ | ○ | ○ | ○ | | | | | | | |
| "E" LEVEL(VfyE) | | | | | | | | | ○ | ○ | ○ | ○ | ○ | ○ | | | | | |
| "F" LEVEL(VfyF) | | | | | | | | | | | | ○ | ○ | ○ | ○ | ○ | | | |
| "G" LEVEL(VfyG) | | | | | | | | | | | | | | ○ | ○ | ○ | ○ | ○ | ○ |

FIG. 8

| THE NUMBER OF LOOPS / WRITING TARGET LEVEL | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" LEVEL (inhibit) | 1 | 1 | 1 | 1 | 1 | 1 | 1 | 1 | 1 | 1 | 1 | 1 | 1 | 1 | 1 | 1 | 1 | 1 | 1 |
| "A" LEVEL | 0/1 | 0/1 | 0/1 | 0/1 | 0/1 | 0/1 | 1 | 1 | 1 | 1 | 1 | 1 | 1 | 1 | 1 | 1 | 1 | 1 | 1 |
| "B" LEVEL | FL | FL | 0/1 | 0/1 | 0/1 | 0/1 | 0/1 | 0/1 | 1 | 1 | 1 | 1 | 1 | 1 | 1 | 1 | 1 | 1 | 1 |
| "C" LEVEL | FL | FL | FL | FL | 0/1 | 0/1 | 0/1 | 0/1 | 0/1 | 0/1 | 1 | 1 | 1 | 1 | 1 | 1 | 1 | 1 | 1 |
| "D" LEVEL | FL | FL | FL | FL | FL | 0/1 | 0/1 | 0/1 | 0/1 | 0/1 | 0/1 | 0/1 | 1 | 1 | 1 | 1 | 1 | 1 | 1 |
| "E" LEVEL | FL | FL | FL | FL | FL | FL | 0/1 | 0/1 | 0/1 | 0/1 | 0/1 | 0/1 | 0/1 | 0/1 | 1 | 1 | 1 | 1 | 1 |
| "F" LEVEL | FL | FL | FL | FL | FL | FL | FL | FL | 0/1 | 0/1 | 0/1 | 0/1 | 0/1 | 0/1 | 0/1 | 0/1 | 1 | 1 | 1 |
| "G" LEVEL | FL | FL | FL | FL | FL | FL | FL | FL | FL | FL | 0/1 | 0/1 | 0/1 | 0/1 | 0/1 | 0/1 | 0/1 | 0/1 | 0/1 |

|  | '1' WRITING (inhibit) | '0' WRITING (program) | QPW | Floating BL |
|---|---|---|---|---|
| SDL | "1" (INV_S="L") | "0" (INV_S="H") | "0" (INV_S="H") | "0" (INV_S="H") |
| LBUS | "0" (LBUS="L") | "1" (LBUS="H") | "1" (LBUS="H") | "0" (LBUS="L") |

FIG. 22

| WRITING TARGET LEVEL \ THE NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" LEVEL (inhibit) | 1 | 1 | 1 | 1 | 1 | 1 | 1 | 1 | 1 | 1 | 1 | 1 | 1 | 1 | 1 | 1 | 1 | 1 | 1 |
| "A" LEVEL | 0/1 | 0/1 | 0/1 | 0/1 | 0/1 | 1 | 1 | 1 | 1 | 1 | 1 | 1 | 1 | 1 | 1 | 1 | 1 | 1 | 1 |
| "B" LEVEL | FL | FL | 0/1 | 0/1 | 0/1 | 0/1 | 1 | 1 | 1 | 1 | 1 | 1 | 1 | 1 | 1 | 1 | 1 | 1 | 1 |
| "C" LEVEL | FL | FL | FL | FL | 0/1 | 0/1 | 0/1 | 0/1 | 1 | 1 | 1 | 1 | 1 | 1 | 1 | 1 | 1 | 1 | 1 |
| "D" LEVEL | FL | FL | FL | FL | FL | 0/1 | 0/1 | 0/1 | 0/1 | 0/1 | 1 | 1 | 1 | 1 | 1 | 1 | 1 | 1 | 1 |
| "E" LEVEL | FL | FL | FL | FL | FL | FL | 0/1 | 0/1 | 0/1 | 0/1 | 0/1 | 0/1 | 1 | 1 | 1 | 1 | 1 | 1 | 1 |
| "F" LEVEL | FL | FL | FL | FL | FL | FL | 1 | 1 | 1 | 0/1 | 0/1 | 0/1 | 0/1 | 0/1 | 0/1 | 1 | 1 | 1 | 1 |
| "G" LEVEL | FL | FL | FL | FL | FL | FL | 1 | 1 | 1 | 1 | 1 | 1 | 0/1 | 0/1 | 0/1 | 0/1 | 0/1 | 0/1 | 0/1 |

FIG. 23

| THE NUMBER OF LOOPS / WRITING TARGET LEVEL | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" LEVEL (inhibit) | 1 | 1 | 1 | 1 | 1 | 1 | 1 | 1 | 1 | 1 | 1 | 1 | 1 | 1 | 1 | 1 | 1 | 1 | 1 |
| "A" LEVEL | 0/1 | 0/1 | 0/1 | 0/1 | 0/1 | 0/1 | 1 | 1 | 1 | 1 | 1 | 1 | 1 | 1 | 1 | 1 | 1 | 1 | 1 |
| "B" LEVEL | FL | 0/1 | 0/1 | 0/1 | 0/1 | 0/1 | 0/1 | 1 | 1 | 1 | 1 | 1 | 1 | 1 | 1 | 1 | 1 | 1 | 1 |
| "C" LEVEL | FL | FL | FL | 0/1 | 0/1 | 0/1 | 0/1 | 0/1 | 1 | 1 | 1 | 1 | 1 | 1 | 1 | 1 | 1 | 1 | 1 |
| "D" LEVEL | FL | FL | FL | FL | FL | 0/1 | 0/1 | 0/1 | 0/1 | 0/1 | 1 | 1 | 1 | 1 | 1 | 1 | 1 | 1 | 1 |
| "E" LEVEL | FL | FL | FL | FL | FL | FL | 0/1 | 0/1 | 0/1 | 0/1 | 0/1 | 0/1 | 1 | 1 | 1 | 1 | 1 | 1 | 1 |
| "F" LEVEL | FL | FL | FL | FL | FL | FL | 0 | 0 | 0/1 | 0/1 | 0/1 | 0/1 | 0/1 | 0/1 | 0/1 | 0/1 | 1 | 1 | 1 |
| "G" LEVEL | FL | FL | FL | FL | FL | FL | 0 | 0 | 0 | 0 | 0 | 0 | 0 | 0/1 | 0/1 | 0/1 | 0/1 | 0/1 | 0/1 |

FIG. 24

| THE NUMBER OF LOOPS / WRITING TARGET LEVEL | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" LEVEL (inhibit) | 1 | 1 | 1 | 1 | 1 | 1 | 1 | 1 | 1 | 1 | 1 | 1 | 1 | 1 | 1 | 1 | 1 | 1 | 1 |
| "A" LEVEL | 0/1 | 0/1 | 0/1 | 0/1 | 0/1 | 0/1 | 1 | 1 | 1 | 1 | 1 | 1 | 1 | 1 | 1 | 1 | 1 | 1 | 1 |
| "B" LEVEL | 0 | 0/1 | 0/1 | 0/1 | 0/1 | 0/1 | 0/1 | 0/1 | 1 | 1 | 1 | 1 | 1 | 1 | 1 | 1 | 1 | 1 | 1 |
| "C" LEVEL | 0 | 0 | 0 | 0/1 | 0/1 | 0/1 | 0/1 | 0/1 | 0/1 | 0/1 | 1 | 1 | 1 | 1 | 1 | 1 | 1 | 1 | 1 |
| "D" LEVEL | 0 | 0 | 0 | 0 | 0 | 0 | 0/1 | 0/1 | 0/1 | 0/1 | 0/1 | 0/1 | 1 | 1 | 1 | 1 | 1 | 1 | 1 |
| "E" LEVEL | 0 | 0 | 0 | 0 | 0 | 0 | FL | 0/1 | 0/1 | 0/1 | 0/1 | 0/1 | 0/1 | 0/1 | 1 | 1 | 1 | 1 | 1 |
| "F" LEVEL | 0 | 0 | 0 | 0 | 0 | 0 | FL | FL | FL | 0/1 | 0/1 | 0/1 | 0/1 | 0/1 | 0/1 | 0/1 | 1 | 1 | 1 |
| "G" LEVEL | 0 | 0 | 0 | 0 | 0 | 0 | FL | FL | FL | FL | FL | FL | FL | 0/1 | 0/1 | 0/1 | 0/1 | 0/1 | 0/1 |

FIG. 25

| THE NUMBER OF LOOPS / WRITING TARGET LEVEL | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" LEVEL (inhibit) | 1 | 0/1 | 1 | 1 | 1 | 1 | 1 | 1 | 1 | 1 | 1 | 1 | 1 | 1 | 1 | 1 | 1 | 1 | 1 |
| "A" LEVEL | 1 | 1 | 0/1 | 0/1 | 0/1 | 1 | 1 | 1 | 1 | 1 | 1 | 1 | 1 | 1 | 1 | 1 | 1 | 1 | 1 |
| "B" LEVEL | 1 | 1 | 1 | 0/1 | 0/1 | 0/1 | 0/1 | 0/1 | 1 | 1 | 1 | 1 | 1 | 1 | 1 | 1 | 1 | 1 | 1 |
| "C" LEVEL | 1 | 1 | 1 | 1 | 0/1 | 0/1 | 0/1 | 0/1 | 0/1 | 0/1 | 1 | 1 | 1 | 1 | 1 | 1 | 1 | 1 | 1 |
| "D" LEVEL | 1 | 1 | 1 | 1 | 1 | 1 | 0/1 | 0/1 | 0/1 | 0/1 | 0/1 | 0/1 | 1 | 1 | 1 | 1 | 1 | 1 | 1 |
| "E" LEVEL | 1 | 1 | 1 | 1 | 1 | 1 | 1 | 0/1 | 0/1 | 0/1 | 0/1 | 0/1 | 0/1 | 0/1 | 1 | 1 | 1 | 1 | 1 |
| "F" LEVEL | 1 | 1 | 1 | 1 | 1 | 1 | FL | FL | FL | FL | 0/1 | 0/1 | 0/1 | 0/1 | 0/1 | 0/1 | 1 | 1 | 1 |
| "G" LEVEL | 1 | 1 | 1 | 1 | 1 | 1 | FL | FL | FL | FL | FL | FL | FL | 0/1 | 0/1 | 0/1 | 0/1 | 0/1 | 0/1 |

FIG. 26

| THE NUMBER OF LOOPS / WRITING TARGET LEVEL | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" LEVEL (inhibit) | 1 | 1 | 1 | 1 | 1 | 1 | 1 | 1 | 1 | 1 | 1 | 1 | 1 | 1 | 1 | 1 | 1 | 1 | 1 |
| "A" LEVEL | 0/1 | 0/1 | 0/1 | 0/1 | 0/1 | 0/1 | 0/1 | 1 | 1 | 1 | 1 | 1 | 1 | 1 | 1 | 1 | 1 | 1 | 1 |
| "B" LEVEL | Vmid | 0/1 | 0/1 | 0/1 | 0/1 | 0/1 | 0/1 | 0/1 | 1 | 1 | 1 | 1 | 1 | 1 | 1 | 1 | 1 | 1 | 1 |
| "C" LEVEL | Vmid | Vmid | 0/1 | 0/1 | 0/1 | 0/1 | 0/1 | 0/1 | 0/1 | 1 | 1 | 1 | 1 | 1 | 1 | 1 | 1 | 1 | 1 |
| "D" LEVEL | Vmid | Vmid | Vmid | 0/1 | 0/1 | 0/1 | 0/1 | 0/1 | 0/1 | 0/1 | 1 | 1 | 1 | 1 | 1 | 1 | 1 | 1 | 1 |
| "E" LEVEL | Vmid | Vmid | Vmid | Vmid | 0/1 | 0/1 | 0/1 | 0/1 | 0/1 | 0/1 | 0/1 | 1 | 1 | 1 | 1 | 1 | 1 | 1 | 1 |
| "F" LEVEL | Vmid | Vmid | Vmid | Vmid | Vmid | 0/1 | 0/1 | 0/1 | 0/1 | 0/1 | 0/1 | 0/1 | 1 | 1 | 1 | 1 | 1 | 1 | 1 |
| "G" LEVEL | Vmid | Vmid | Vmid | Vmid | Vmid | Vmid | Vmid | Vmid | Vmid | Vmid | Vmid | 0/1 | 0/1 | 0/1 | 0/1 | 0/1 | 0/1 | 0/1 | 0/1 |

"1"=VDD,
"0"=VSS,
VSS<Vmid<VDD

FIG. 27

| THE NUMBER OF LOOPS / WRITING TARGET LEVEL | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" LEVEL (inhibit) | 1 | 1 | 1 | 1 | 1 | 1 | 1 | 1 | 1 | 1 | 1 | 1 | 1 | 1 | 1 | 1 | 1 | 1 | 1 |
| "A" LEVEL | 0/1 | 0/1 | 0/1 | 0/1 | 0/1 | 0/1 | 1 | 1 | 1 | 1 | 1 | 1 | 1 | 1 | 1 | 1 | 1 | 1 | 1 |
| "B" LEVEL | 0 | 0/1 | 0/1 | 0/1 | 0/1 | 0/1 | 1 | 1 | 1 | 1 | 1 | 1 | 1 | 1 | 1 | 1 | 1 | 1 | 1 |
| "C" LEVEL | 0 | 0 | 0/1 | 0/1 | 0/1 | 0/1 | 0/1 | 1 | 1 | 1 | 1 | 1 | 1 | 1 | 1 | 1 | 1 | 1 | 1 |
| "D" LEVEL | 0 | 0 | 0 | 0 | 0/1 | 0/1 | 0/1 | 0/1 | 0/1 | 1 | 1 | 1 | 1 | 1 | 1 | 1 | 1 | 1 | 1 |
| "E" LEVEL | 0 | 0 | 0 | 0 | 0 | 0 | 0/1 | 0/1 | 0/1 | 0/1 | 0/1 | 1 | 1 | 1 | 1 | 1 | 1 | 1 | 1 |
| "F" LEVEL | 0 | 0 | 0 | 0 | 0 | 0 | 1 | 1 | 0/1 | 0/1 | 0/1 | 0/1 | 0/1 | 0/1 | 1 | 0/1 | 1 | 1 | 1 |
| "G" LEVEL | 0 | 0 | 0 | 0 | 0 | 0 | 1 | 1 | 1 | 1 | 1 | 1 | 1 | 0/1 | 0/1 | 0/1 | 0/1 | 0/1 | 0/1 |

SEMICONDUCTOR MEMORY DEVICE

CROSS-REFERENCE TO RELATED APPLICATION

This application is a divisional of U.S. patent application Ser. No. 15/987,810, filed May 23, 2018, which is a divisional of U.S. patent application Ser. No. 15/233,658, filed Aug. 10, 2016, now U.S. Pat. No. 9,984,761, issued May 29, 2018, which is based upon and claims the benefit of priority from Japanese Patent Application No. 2015-246749, filed Dec. 17, 2015; the entire contents of which are incorporated herein by reference.

FIELD

Embodiments described herein relate generally to a semiconductor memory device.

BACKGROUND

NAND-type flash memories having memory cells that are arranged three-dimensionally are known.

DESCRIPTION OF THE DRAWINGS

FIG. 7 is a diagram showing a relationship between the number of loops and programming verification during a writing operation of the semiconductor memory device according to the first embodiment.

FIG. 8 is a diagram showing a relationship between the number of loops and a bit line voltage during a writing operation of the semiconductor memory device according to the first embodiment.

FIG. 22 is a diagram showing a relationship between the number of loops and a bit line voltage during a writing operation of a semiconductor memory device according to a third embodiment.

FIG. 23 is a diagram showing a relationship between the number of loops and a bit line voltage during a writing operation of the semiconductor memory device according to the third embodiment.

FIG. 24 is a diagram showing a relationship between the number of loops and a bit line voltage during a writing operation of the semiconductor memory device according to the third embodiment.

FIG. 25 is a diagram showing a relationship between the number of loops and a bit line voltage during a writing operation of the semiconductor memory device according to the third embodiment.

FIG. 26 is a diagram showing a relationship between the number of loops and a bit line voltage during a writing operation of the semiconductor memory device according to the third embodiment.

FIG. 27 is a diagram showing a relationship between the number of loops and a bit line voltage during a writing operation of a semiconductor memory device according to a fourth embodiment.

DETAILED DESCRIPTION

Figure 1:
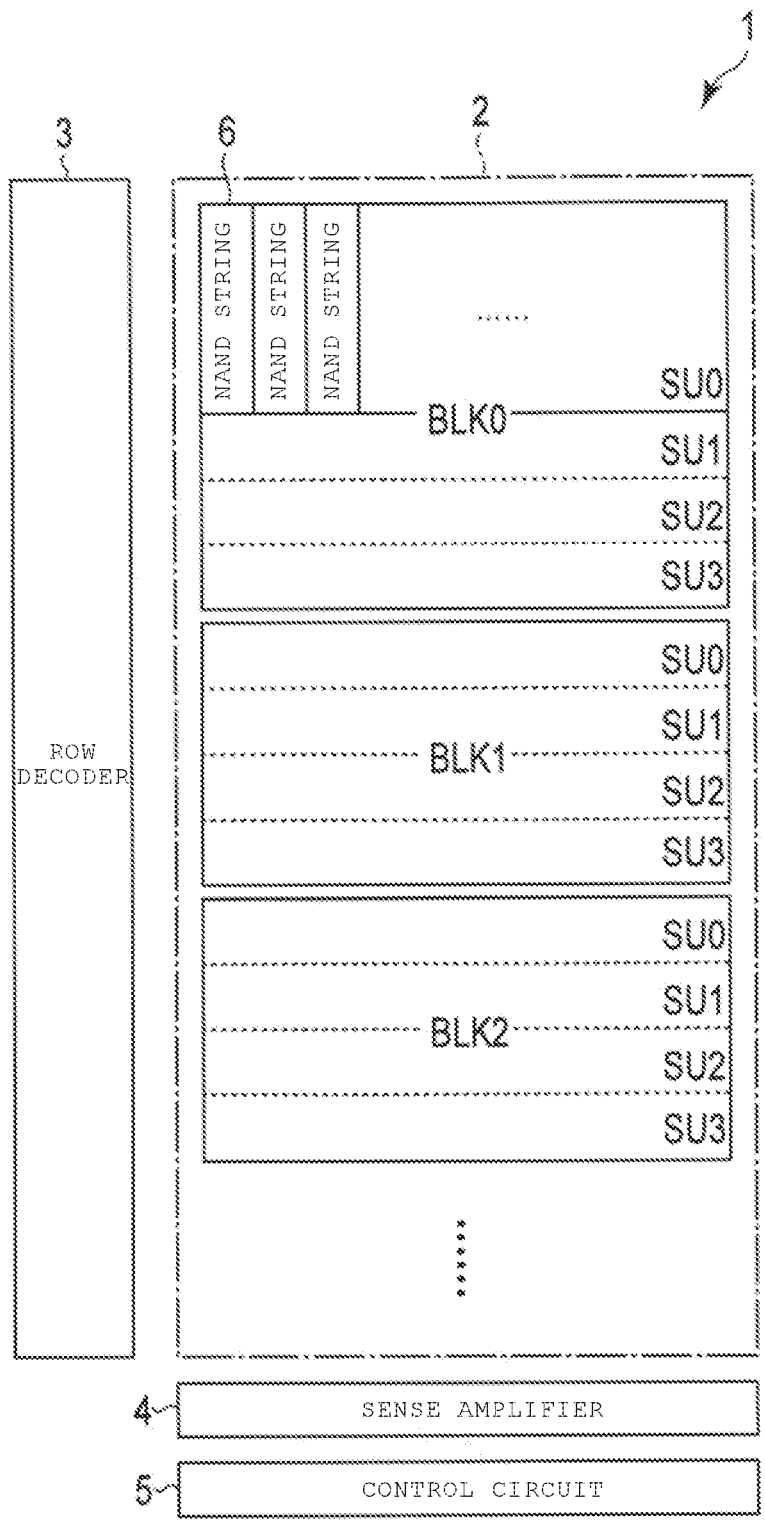
FIG. 1 is a block diagram of a semiconductor memory device according to a first embodiment.

A semiconductor memory device capable of reducing power consumption is provided.

In general, according to an embodiment, a semiconductor memory device includes first and second memory cells, each of which includes a charge storage layer, a first bit line that is connected to the first memory cell, and a second bit line that is connected to the second memory cell. A writing operation includes multiple loops of a programming operation and a verification operation, and first data is written in the first memory cell, and second data different from the first data is written in the second memory cell through the writing operation. In a first loop of the writing operation, a first voltage is applied to the first bit line and the second bit line is maintained in an electrically floating state during the programming operation, and a verification operation relating to the second data is not performed and a verification operation relating to the first data is performed.

Hereinafter, embodiments will be described with reference to the accompanying drawings. Meanwhile, in the following description, components having the same function and configuration will be denoted by common reference numerals and signs.

1. First Embodiment

A semiconductor memory device according to a first embodiment will be described. Hereinafter, a three-dimensional stacked NAND-type flash memory in which memory cells are three-dimensionally stacked on a semiconductor substrate will be described as an example of the semiconductor memory device.

1.1 Configuration

1.1.1 Overall Configuration of Semiconductor Memory Device

First, the overall configuration of a semiconductor memory device according to this embodiment will be described with reference to FIG. 1. FIG. 1 is a block diagram of a NAND-type flash memory according to this embodiment.

As shown in the drawing, a NAND-type flash memory 1 includes a memory cell array 2, a row decoder 3, a sense amplifier 4, and a control circuit 5.

The memory cell array 2 includes a plurality of blocks BLK (BLK0, BLK1, BLK2, . . . ) including nonvolatile memory cell transistors arranged in a matrix configuration. Each of the blocks BLK includes, for example, four string units SU (SU0 to SU3). In addition, each of the string units SU includes a plurality of NAND strings 6. The number of blocks in the memory cell array 2 and the number of string units in the block are arbitrary. The memory cell array 2 will be described later in detail.

The row decoder 3 decodes a row address, selects any of the blocks BLK and any of the string units SU based on a result of the decoding. In addition, a necessary voltage is output to the block BLK. The row address is received from a controller that controls, for example, the NAND-type flash memory 1.

The sense amplifier 4 senses data which is read out from the memory cell array 2 during the read-out of data. In addition, the read-out data is output to the controller. Writing data received from the controller is transmitted to the memory cell array 2 during data writing.

The control circuit 5 controls the operation of the entire NAND-type flash memory 1.

1.1.2 Configuration of Block BLK

Figure 2:
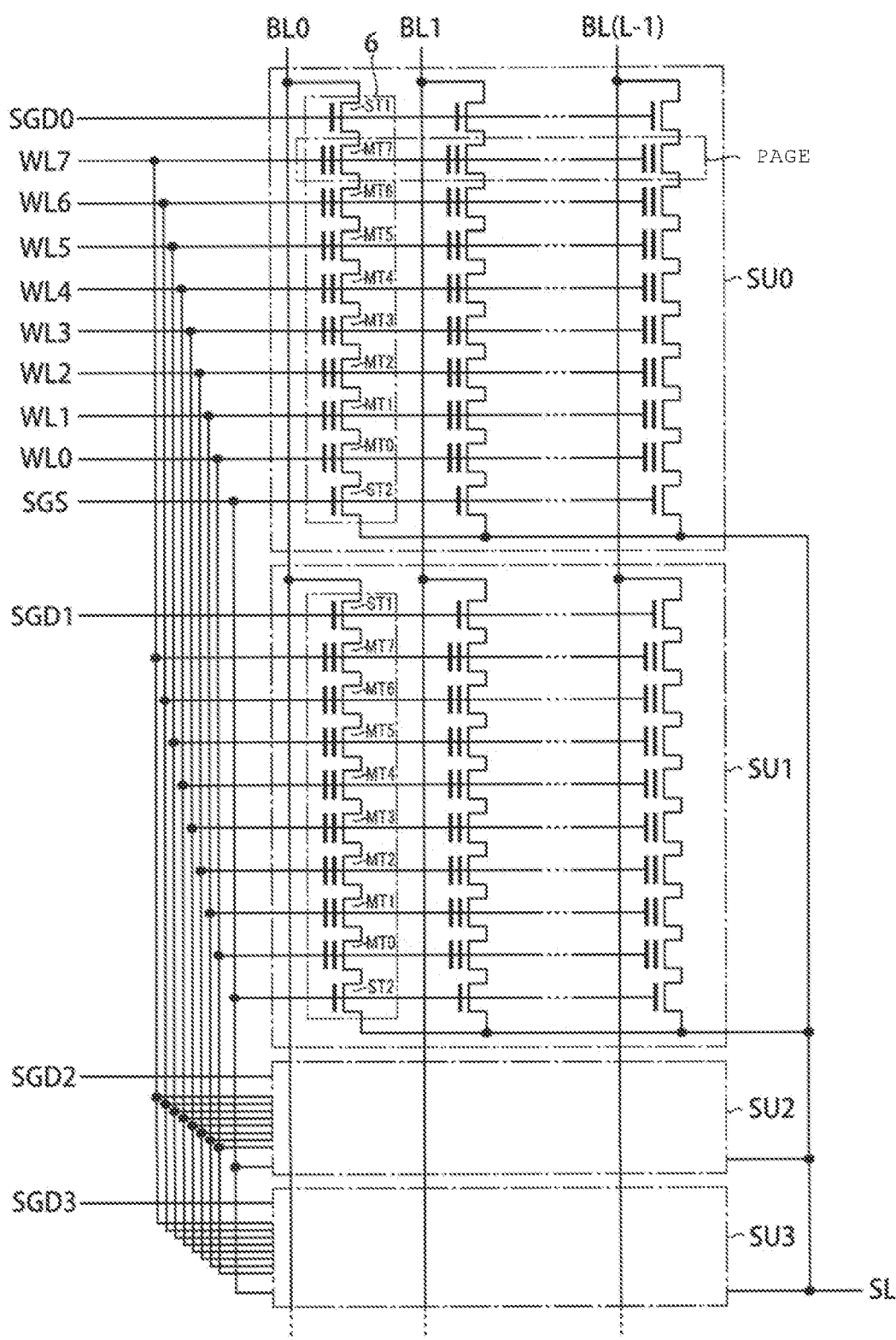
FIG. 2 is a circuit diagram of a block included in the semiconductor memory device according to the first embodiment.

Next, a configuration of the above-mentioned block BLK will be described with reference to FIG. 2. As described above, the block BLK includes, for example, four string units SU, and each of the string units SU includes a plurality of NAND strings 6.

Each of the NAND strings 6 includes, for example, eight memory cell transistors MT (MT0 to MT7) and selection transistors ST1 and ST2. The memory cell transistor MT includes a control gate and a charge storage layer, and holds data in a nonvolatile manner. In addition, the memory cell transistors MT are connected to each other in series between a source of the selection transistor ST1 and a drain of the selection transistor ST2.

A gate of the selection transistor ST1 in each of the string units SU0 to SU3 is connected to respective one of select-gate lines SGD0 to SGD3. On the other hand, gates of the selection transistors ST2 in the respective string units SU0 to SU3 are connected to, for example, a select-gate line SGS in common. Alternatively, string units may be connected to different select-gate lines SGS0 to SGS3, respectively. In addition, control gates of the memory cell transistors MT0 to MT7 within the same block BLK are connected to word lines WL0 to WL7, respectively.

In addition, drains of the selection transistors ST1 of the NAND strings 6 in the same column within the memory cell array 2 are connected to bit lines BL (BL0 to BL(L−1), where (L−1) is a natural number of 2 or greater) in common. That is, the bit line BL connects the NAND strings 6 across the plurality of blocks BLK in common. Further, sources of the plurality of selection transistors ST2 are connected to a source line SL in common.

In other words, the string unit SU is an assembly of the NAND strings 6 that are connected to different bit lines BL and are connected to the same select-gate line SGD. In addition, the block BLK is an assembly of the plurality of string units SU sharing the word lines WL. In addition, the memory cell array 2 is an assembly of the plurality of blocks BLK sharing the bit lines BL.

Figure 3:
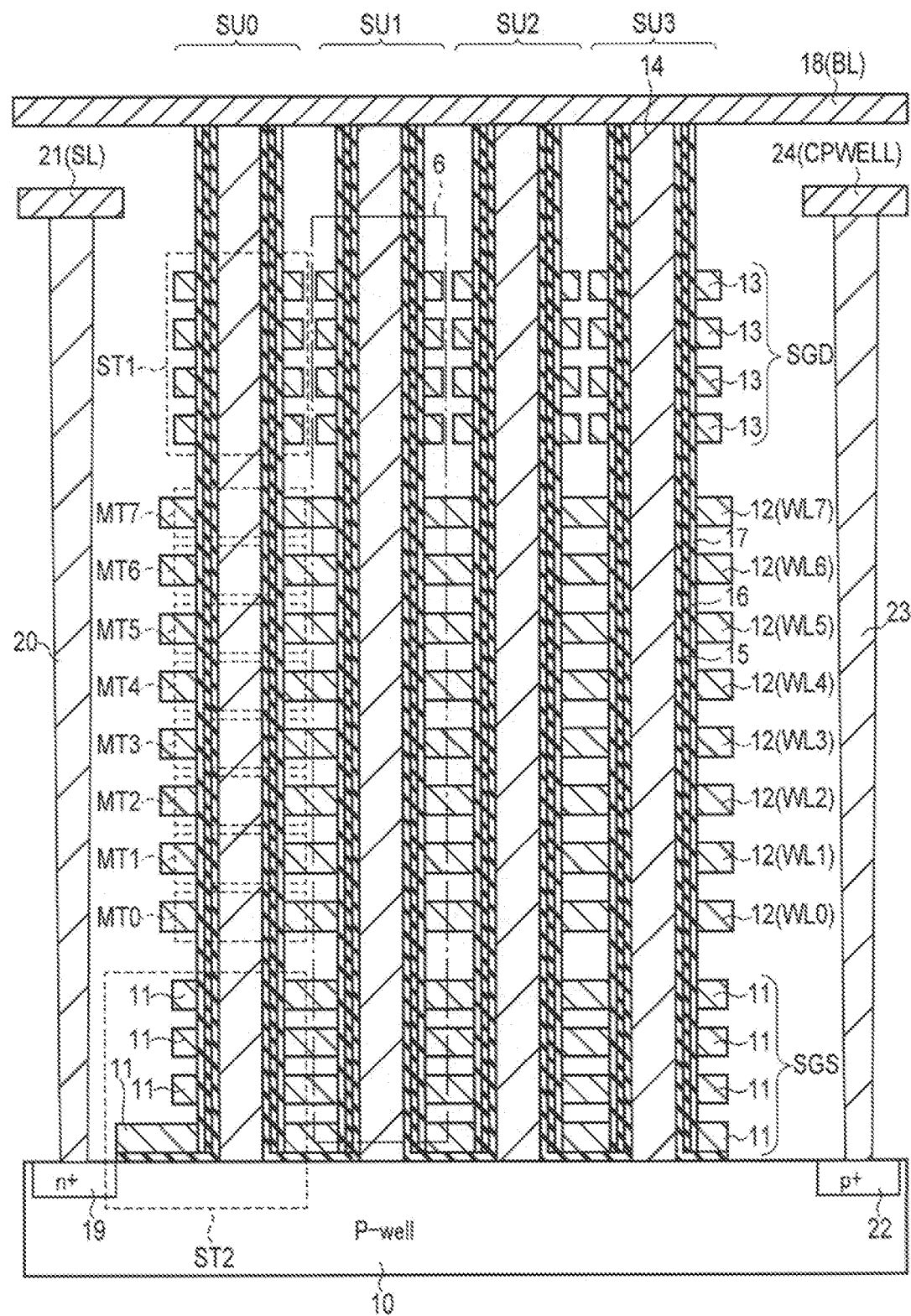
FIG. 3 is a cross-sectional diagram of the block included in the semiconductor memory device according to the first embodiment.

FIG. 3 is a cross-sectional diagram of a partial region of the block BLK. As shown in the drawing, the plurality of NAND strings 6 are formed on a p-type well region 10. That is, for example, four wiring layers 11 functioning as the select-gate line SGS, eight wiring layers 12 functioning as the word lines WL0 to WL7, and, for example, four wiring layers 13 functioning as the select-gate line SGD are sequentially stacked on the well region 10. An insulating film not shown in the drawing is formed between the stacked wiring layers.

In addition, a pillar-shaped conductor 14 (made of, e.g., a semiconductor material) passing through wiring layers 13, 12, and 11 and reaching the well region 10 is formed. A gate insulating film 15, a charge storage layer (an insulating film or a conductive film) 16, and a block insulating film 17 are sequentially formed on a side surface of the conductor 14, and the memory cell transistors MT and the selection transistors ST1 and ST2 are formed by these sequentially formed films. The conductor 14 functions as a current path of the NAND string 6, and serves as a region in which a channel of each transistor is formed. In addition, an upper end of the conductor 14 is connected to a metal wiring layer 18 functioning as the bit line BL.

An n+ type impurity diffusion layer 19 is formed in the surface region of the well region 10. A contact plug 20 is formed on the diffusion layer 19, and the contact plug 20 is connected to a metal wiring layer 21 functioning as a source line SL. Further, a p+ type impurity diffusion layer 22 is formed in the surface region of the well region 10. A contact plug 23 is formed on the diffusion layer 22, and the contact plug 23 is connected to a metal wiring layer 24 functioning as a well wiring CPWELL. The well wiring CPWELL is a wiring for applying a potential to the conductor 14 through the well region 10.

A plurality of configurations described above are arrayed in a depth direction of the paper of FIG. 3, and the string unit SU is formed by a set of plurality of NAND strings 6 arranged in the depth direction.

In addition, the erasing of data can be performed in units of the blocks BLK or in units smaller than the blocks BLK. An erasure method is disclosed in, for example, U.S. patent application Ser. No. 13/235,389, filed on Sep. 18, 2011, which is entitled "NONVOLATILE SEMICONDUCTOR MEMORY DEVICE." In addition, an erasure method is disclosed in U.S. patent application Ser. No. 12/694,690, filed on Jan. 27, 2010, which is entitled "NON-VOLATILE SEMICONDUCTOR STORAGE DEVICE." Further, an erasure method is disclosed in U.S. patent application Ser. No. 13/483,610, filed on May 30, 2012, which is entitled "NONVOLATILE SEMICONDUCTOR MEMORY DEVICE AND DATA ERASE METHOD THEREOF." All of these patent applications are incorporated by reference herein in their entireties.

Further, the memory cell array 2 may have different configurations, e.g., the configuration of the memory cell array disclosed in U.S. patent application Ser. No. 12/407,403, filed on Mar. 19, 2009, which is entitled "THREE DIMENSIONAL STACKED NONVOLATILE SEMICONDUCTOR MEMORY," U.S. patent application Ser. No. 12/406,524, filed on Mar. 18, 2009, which is entitled "THREE DIMENSIONAL STACKED NONVOLATILE SEMICONDUCTOR MEMORY," U.S. patent application Ser. No. 12/679,991, filed on Mar. 25, 2010, which is entitled "NON-VOLATILE SEMICONDUCTOR STORAGE DEVICE AND METHOD OF MANUFACTURING THE SAME," and U.S. patent application Ser. No. 12/532,030, filed on Mar. 23, 2009, which is entitled "SEMICONDUCTOR MEMORY AND METHOD FOR MANUFACTURING SAME." All of these patent applications are incorporated by reference herein in their entireties.

1.1.3 Distribution of Threshold Distribution of Memory Cell Transistor

Next, a possible threshold distribution of the memory cell transistor MT according to this embodiment will be described with reference to FIG. 4.

As shown in the drawing, a threshold voltage of each of the memory cell transistors MT has a discrete value, for example, a value included in any of eight distributions. These eight distributions are referred to as an "Er" level, an "A" level, a "B" level, a "C" level, a "D" level, an "E" level, an "F" level, and a "G" level in ascending order of a threshold voltage value.

The "Er" level is equivalent to, for example, a data erasure state. In addition, a threshold voltage value included in the "Er" level is smaller than a voltage VfyA and is a positive or negative value.

The "A" to "G" levels are equivalent to a state in which charge is injected into a charge storage layer and data is written, and a threshold voltage value included in each distribution is, for example, a positive or negative value. A threshold voltage value included in the "A" level is a voltage VfyA or greater and is less than a voltage VfyB (here, VfyB>VfyA). A threshold voltage value included in the "B" level is a voltage VfyB or greater and is less than a voltage VfyC (here, VfyC>VfyB). A threshold voltage value included in the "C" level is a voltage VfyC or greater and is less than a voltage VfyD (here, VfyD>VfyC). A threshold voltage value included in the "D" level is a voltage VfyD or greater and is less than a voltage VfyE (here, VfyE>VfyD). A threshold voltage value included in the "E" level is a voltage VfyE or greater and is less than a voltage VfyF (here, VfyF>VfyE). A threshold voltage value included in the "F" level is a voltage VfyF or greater and is less than a voltage VfyG (here, VfyG>VfyF). In addition, a threshold voltage value included in the "G" level is a voltage VfyG or greater and is less than voltages VREAD and VPASS (here, VREAD>VfyG). Meanwhile, VREAD is a voltage applied to a non-selected word line during the read-out of data, and VPASS is a voltage applied to a non-selected word line during data writing.

As described above, each of the memory cell transistors MT has any of eight threshold distributions, and thus can take eight types of states. These states are allocated to "000" to "111" as binary numbers, and each of the memory cell transistors MT can hold 3-bit data.

In addition, bits of the 3-bit data may be referred to as a high-order bit, a middle-order bit, and a low-order bit, respectively. Further, although details will be described later, data is collectively written with respect to a plurality of memory cell transistors (for example, L memory cell transistors connected to all bit lines) which are connected to any one word line. This unit is referred to as a page. In addition, a set of high-order bits that are collectively written may be referred to as an upper page, a set of middle-order bits may be referred to as a middle page, and a set of low-order bits may be referred to as a lower page.

Figure 4:
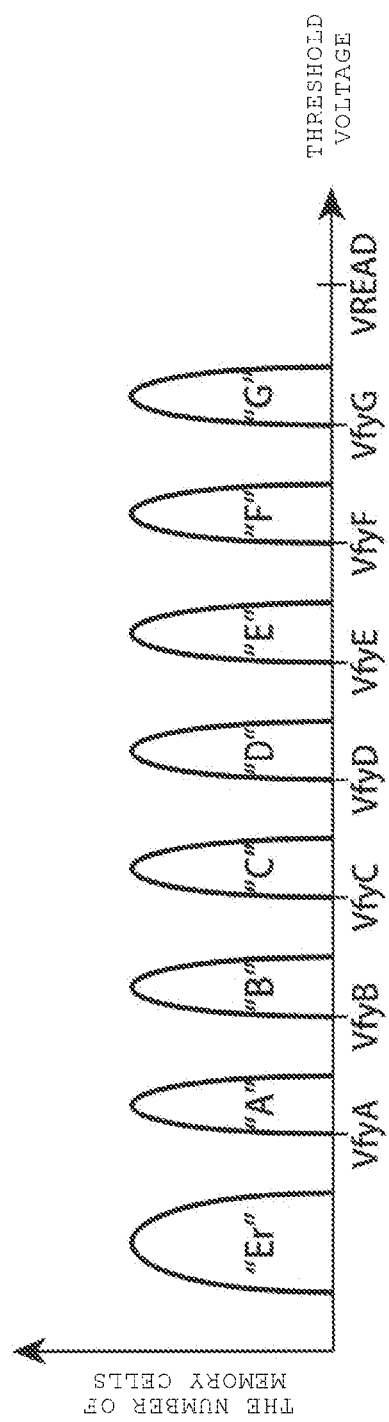
FIG. 4 is a graph showing distribution of threshold voltage values of a memory cell transistor according to the first embodiment.

Meanwhile, although a case where eight levels are discretely distributed is described as an example in FIG. 4, this is an ideal state, for example, immediately after data writing. Accordingly, realistically, adjacent levels may overlap each other. For example, after data writing, an upper end of the "Er" level and a lower end of the "A" level may overlap each other due to disturbance or the like. In this case, data is corrected using, for example, an ECC technique or the like.

1.2 Write Operation

Next, a data writing operation according to this embodiment will be described.

1.2.1 Concept of Write Operation

First, a writing operation according to this embodiment will be briefly described. First, the writing operation roughly includes a programming operation and a verification operation.

The programming operation is an operation of injecting electrons into a charge storage layer, thereby increasing a threshold voltage value (or inhibiting injection, thereby maintaining a threshold voltage value). Hereinafter, an operation of increasing a threshold voltage value is referred to as "'0' programming" or "'0' writing", and a bit line BL which is a target for '0' programming is given '0' data. On the other hand, an operation of maintaining a threshold voltage value is referred to as "'1' programming", "'1' writing", or "writing inhibition", and a bit line BL which is a target for '1' programming is given '1' data. In addition, in this embodiment, a bit line BL corresponding to a memory cell transistor MT which is not a target for '1' programming and is not also a target for '0' programming is in a floating state. This will be described later in detail.

The verification operation is an operation of reading out data after a programming operation is performed, thereby determining whether or not a threshold voltage value of a memory cell transistor MT reaches a target level. The memory cell transistor MT reaching the target level is inhibited from writing thereafter.

A combination of the above-mentioned programming operation and verification operation is repeated, and thus the threshold voltage value of the memory cell transistor MT is increased to the target level.

Figure 5:
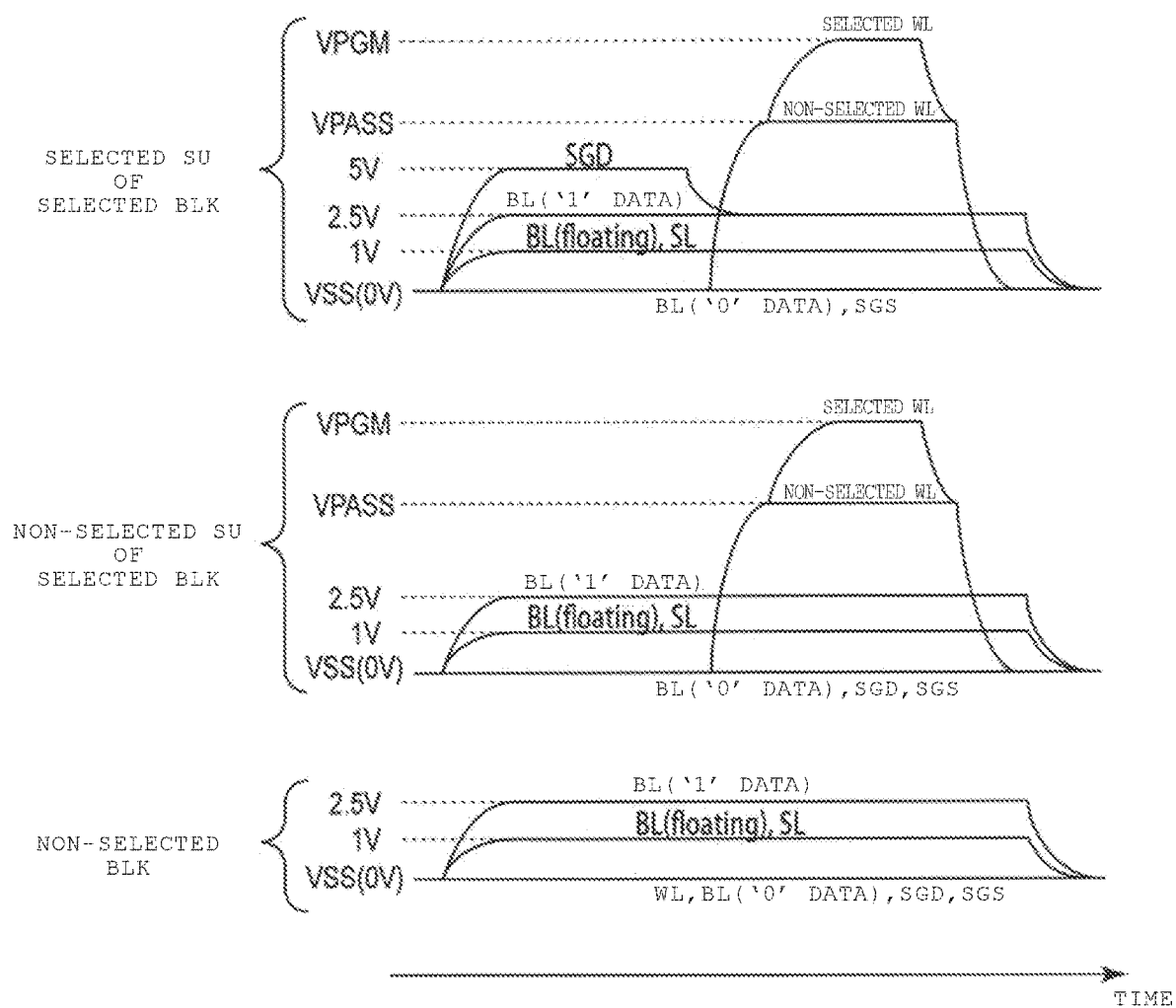
FIG. 5 is a timing chart showing voltages of various wirings during a writing operation of the semiconductor memory device according to the first embodiment.

FIG. 5 shows changes in a potential of each wiring during a programming operation. As shown in the drawing, first, the sense amplifier 4 transmits programming data to each bit line BL. An "L" level, for example, 0 V is applied to a bit line BL given '0' data. An "H" level, for example, 2.5 V is applied to a bit line BL given '1' data. A potential of a bit line BL set to be in a floating state increases up to, for example, approximately 1 V due to capacity coupling to a surrounding wiring.

In addition, the row decoder 3 selects any of the blocks BLK and selects any of the string units SU. In addition, for example, 5V is applied to a select-gate line SGD in the selected string unit SU, thereby turning a selection transistor ST1 on. On the other hand, 0 V is applied to a select-gate line SGS, thereby setting a selection transistor ST2 to be in an off state.

Further, the row decoder 3 sets select-gate lines SGD and SGS of a non-selected string unit SU in a selected block BLK and a non-selected string unit SU in a non-selected block BLK to 0 V, thereby turning the selection transistors ST1 and ST2 off.

In addition, a source line SL is set as, for example, 1 V (potential higher than the potential of the select-gate line SGS).

Thereafter, the row decoder 3 sets the potential of the select-gate line SGD in the selected string unit SU in the selected block BLK as, for example, 2.5 V. The potential is a voltage that turns on a selection transistor ST1 corresponding to a bit line BL given '0' data (0 V) and cuts off a selection transistor ST1 corresponding to a bit line BL given '1' data (2.5 V).

In addition, the row decoder 3 selects any of the word lines WL in the selected block BLK, applies a voltage VPGM to the selected word line, and applies a voltage VPASS to the other non-selected word lines WL. The voltage VPGM is a high voltage for injecting electrons into a charge storage layer in accordance with a tunneling phenomenon and satisfies the relation of VPGM>VPASS. The state of a string unit SU at this time is shown in FIG. 6.

Figure 6:
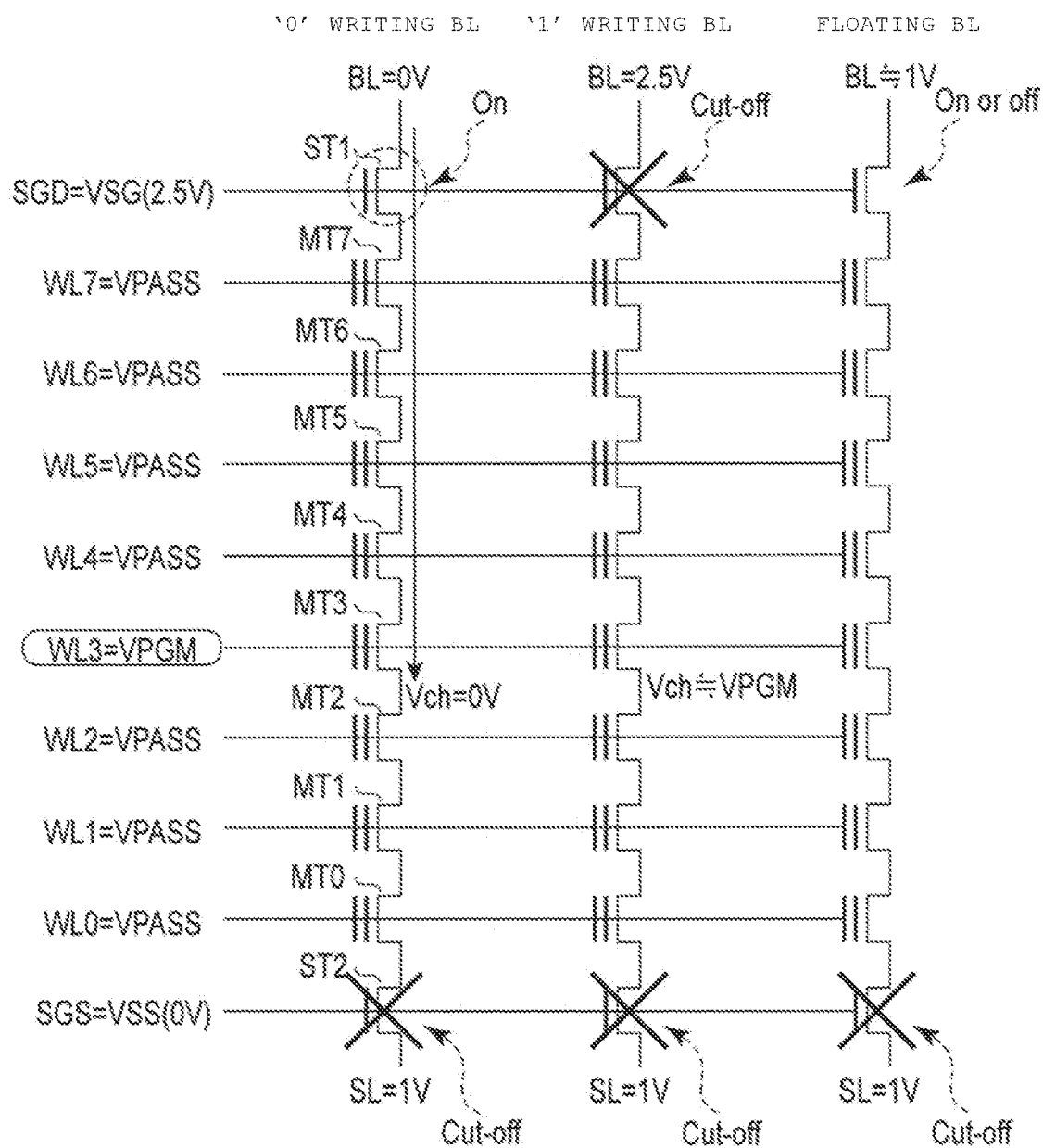
FIG. 6 is a circuit diagram showing a state during a writing operation of the semiconductor memory device according to the first embodiment.

FIG. 6 shows three NAND strings corresponding to a bit line BL which is a target for '0' writing, a bit line BL which is a target for '1' writing, and a bit line BL which is in a floating state. In addition, a state where a word line WL3 is selected is shown.

As shown in the drawing, a voltage VPGM is applied to a selected word line WL3, and a voltage VPASS is applied to non-selected word lines WL0 to WL2 and WL4 to WL7.

In addition, in the NAND string corresponding to the bit line BL which is a target for '0' writing, a selection transistor ST1 is turned on. For this reason, a channel potential Vch of a memory cell transistor MT3 which is connected to the selected word line WL3 is set as 0 V. That is, a difference in potential between a control gate and a channel increases. As a result, electrons are injected into a charge storage layer, and thus a threshold voltage value of the memory cell transistor MT3 is increased.

In the NAND string corresponding to the bit line BL which is a target for '1' writing, a selection transistor ST1 is in a cut-off state. For this reason, a channel of a memory cell transistor MT3 which is connected to the selected word line WL3 is in an electrically floating state, and thus a channel potential Vch increases up to approximately a voltage VPGM due to capacity coupling to a word line WL or the like. That is, a difference in potential between a control gate and a channel decreases. As a result, electrons are not injected into a charge storage layer, and thus a threshold voltage value of the memory cell transistor MT3 is maintained (the threshold voltage value does not fluctuate to the extent that that a threshold voltage distribution level transitions to a higher level).

A selection transistor ST1 of a NAND string having a bit line BL to be in a floating state is in an on or off state in accordance with the potential of the bit line BL. In addition, even in an on or off state, the selection transistor is in a strong on state or a weak on state or is in a strong off state or a weak off state in accordance with the potential of the bit line BL. According to such a state, a channel potential of the NAND string is determined, and a threshold voltage value of a memory cell transistor MT3 is slightly increased or is substantially maintained.

1.2.2 Specific Example of Write Operation

A writing operation according to this embodiment will be described in more detail with reference to FIGS. 7 and 8. In FIGS. 7 and 8, a case where data is written by a combination of a programming operation and a verification operation being repeated 19 times is shown as an example. Such a repetition operation is referred to as a "loop".

FIG. 7 shows a target level of a verification operation performed in each loop. As shown in the drawing, in first and second loops, verification is performed with respect to only an "A" level. In other words, during the verification operation, a voltage VfyA is applied to a selected word line WL, and voltages VfyB to VfyG are not applied. Subsequently, in third and fourth loops, a verification operation is performed with respect to the "A" level and a "B" level. In other words, during the verification operation, voltages VfyA and VfyB are sequentially applied to a selected word line WL, and voltages VfyC to VfyG are not applied.

In fifth and sixth loops, a verification operation is performed with respect to the "A" level, the "B" level, and a "C" level. In other words, during the verification operation, voltages VfyA, VfyB, and VfyC are sequentially applied to a selected word line WL, and voltages VfyD to VfyG are not applied. In addition, the verification operation targeted at the "A" level is completed in the sixth loop. This is because a fact that programming for the "A" level is substantially completed by, for example, six loops is statistically obtained.

In addition, in seventh and eighth loops, a verification operation is performed with respect to the "B" level, the "C" level, and a "D" level. In other words, voltages VfyB, VfyC, and VfyD are sequentially applied to a selected word line WL during the verification operation. In addition, the verification operation targeted at the "B" level is completed in the eighth writing operation. Further, in ninth and tenth loops, a verification operation is performed with respect to the "C" level, the "D" level, and an "E" level. In other words, voltages VfyC, VfyD, and VfyE are sequentially applied to a selected word line WL during the verification operation. In addition, the verification operation targeted at the "C" level is completed in the tenth loop.

Hereinafter, writing for up to a "G" level is similarly performed, and a loop is repeated a maximum of 19 times.

FIG. 8 corresponds to FIG. 7 and shows the state of a bit line according to a target level of a threshold voltage value in each loop. In FIG. 8, the notation of '1' means that '1' data is given to the corresponding bit line BL, the notation of '0' means that '0' data is given to the corresponding bit line, and the notation of "FL" means that a bit line BL is in a floating state.

As shown in the drawing, when a threshold voltage value of a memory cell transistor MT has to be maintained at an "Er" level, '1' data is given to a bit line BL throughout all loops. That is, a selection transistor ST1 is in a cut-off state during a writing operation.

A '0' programming operation may be performed in first to sixth loops when a target level of a threshold voltage value is an "A" level, in other words, with respect to a memory cell transistor MT in which a threshold voltage value has to be increased from a value within the "Er" level to a value within the "A" level. This corresponds to a loop in which a verification operation with respect to the "A" level is performed. '0' data is given to a bit line BL before the bit line passes verification, and '1' data is given thereto after the bit line passes the verification. In addition, '1' data is given to a bit line BL even in a seventh loop in which a programming operation is completed and the subsequent loops, and thus the bit line is inhibited from writing.

A '0' programming operation may be performed in third to eighth loops when a target level is a "B" level, in other words, with respect to a memory cell transistor MT in which a threshold voltage value has to be increased from a value within the "Er" level to a value within the "B" level. This corresponds to a loop in which a verification operation with respect to the "B" level is performed. In the first and second loops, a bit line BL is in a floating state. In the subsequent third to eighth loops, '0' data is given to a bit line BL before the bit line passes verification, and '1' data is given thereto after the bit line passes the verification. In addition, '1' data is given to a bit line BL even in a ninth loop in which a programming operation is completed and the subsequent loops, and thus the bit line is inhibited from writing.

When a target level is a "C" level, a '0' programming operation may be performed in fifth to tenth loops. In the first to fourth loops, a bit line BL is in a floating state. In the subsequent fifth to tenth loops, '0' data is given to a bit line BL before the bit line passes verification, and '1' data is given after the bit line passes the verification. In addition, even in an eleventh loop in which a programming operation is completed and the subsequent loops, '1' data is given to a bit line BL, and thus the bit line is inhibited from writing.

Thereafter, a programming operation is similarly performed up to a "G" level.

Figure 9:
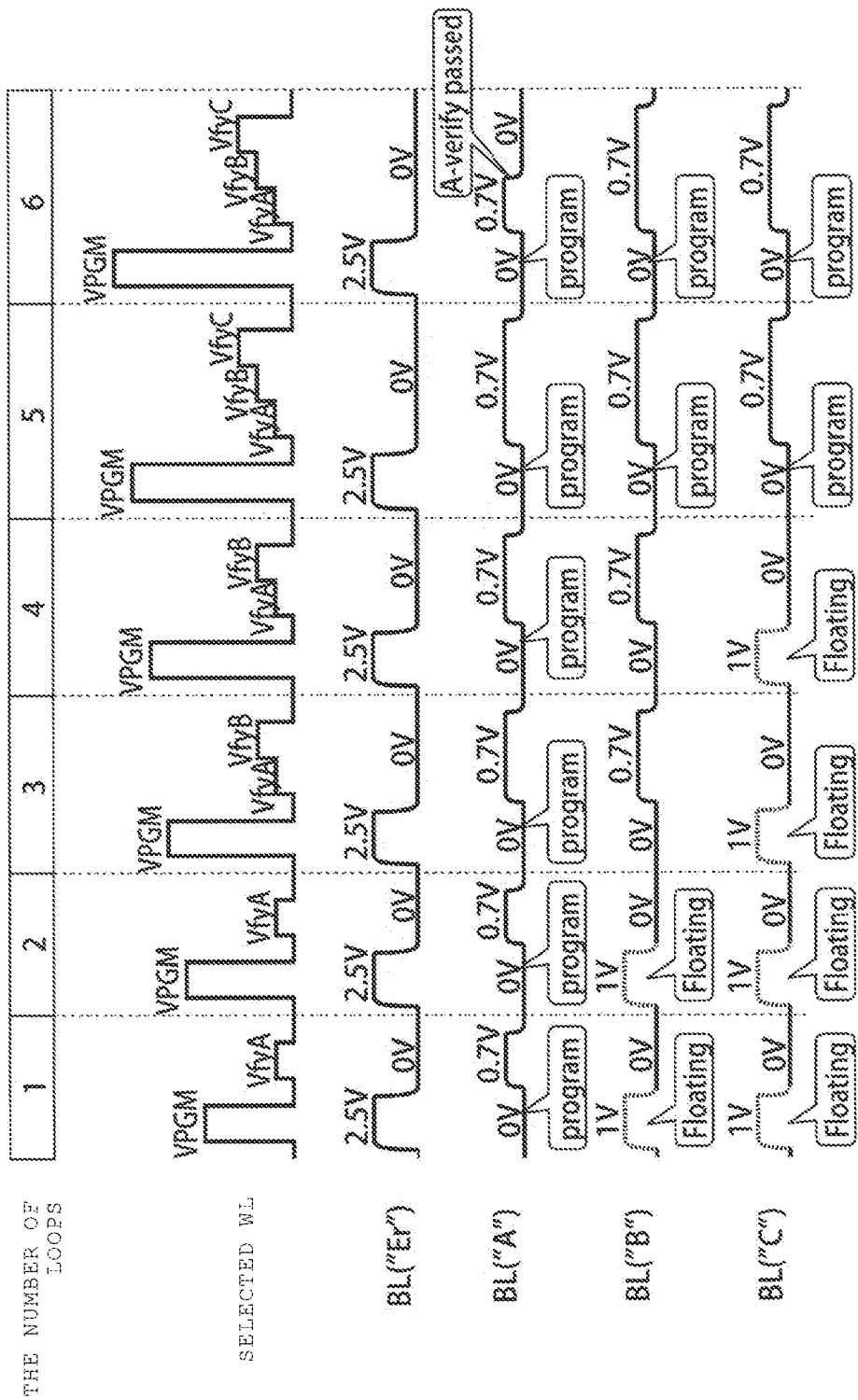
FIG. 9 is a timing chart showing voltages of selected word lines and bit lines during a writing operation of the semiconductor memory device according to the first embodiment.
Figure 10:
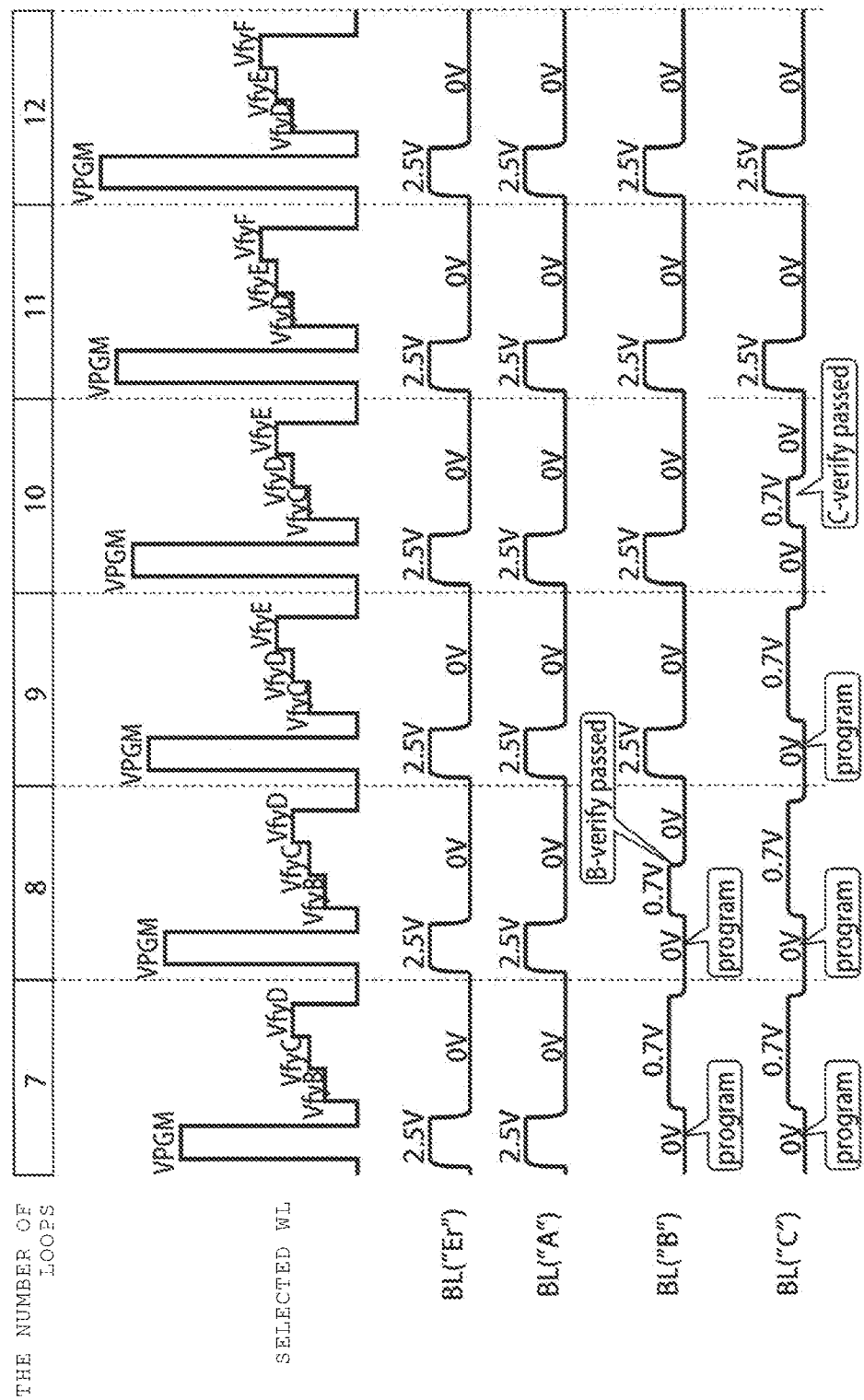
FIG. 10 is a timing chart showing voltages of selected word lines and bit lines during a writing operation of the semiconductor memory device according to the first embodiment.

The state of a potential of each wiring during the above-described operation is shown in FIGS. 9 and 10. FIGS. 9 and 10 show changes over time in a potential of a selected word line WL, a potential of a bit line BL (denoted by BL ("Er") in FIGS. 9 and 10) corresponding to a memory cell transistor MT in which an "Er" level has to be maintained, and potentials of bit lines BL (denoted by BL ("A"), BL ("B"), and BL ("C") in FIG. 9) corresponding to a memory cell transistor MT in which a threshold voltage value has to be increased to a value within "A" to "C" levels, in first to twelfth loops.

As shown in the drawing, in a first loop, '0' programming is performed on the bit line BL ("A"), and the bit lines BL ("B") and BL ("C") are in a floating state. In addition, a verification operation is performed with respect to only the "A" level. That is, the bit line BL ("A") is precharged to, for example, 0.7 V, and a verification voltage VfyA is applied to the selected word line WL. The other bit lines BL ("Er"), BL ("B"), and BL ("C") and the like are fixed to, for example, 0 V or the like, and are excluded from targets for verification. In a second loop, a voltage VPGM is stepped up, and thus the same operation as in the first loop is performed.

In a third loop, '0' programming is performed on the bit lines BL ("A") and BL ("B"), and the bit line BL ("C") is in a floating state. In addition, a verification operation is performed with respect to the "A" level and the "B" level. That is, the bit lines BL ("A") and BL ("B") are precharged to, for example, 0.7 V, and verification voltages VfyA and VfyB are sequentially applied to the selected word line WL. The other bit lines BL ("Er") and BL ("C") are fixed to, for example, 0 V or the like, and are excluded from targets for verification. In a fourth loop, a voltage VPGM is stepped up, and thus the same operation as in the third loop is performed.

In a fifth loop, '0' programming is performed on the bit lines BL ("A"), BL ("B"), and BL ("C"). In addition, a verification operation is performed with respect to the "A" level, the "B" level, and the "C" level. In a sixth loop, a voltage VPGM is stepped up, and thus the same operation as in the fifth loop is performed.

Hereinafter, a writing operation is similarly performed, and all of the bit lines BL ("A"), BL ("B"), and BL ("C") are inhibited from writing in an eleventh loop.

Meanwhile, a timing when a voltage corresponding to '0' data or '1' data is applied to a bit line BL and a timing when a bit line BL is in a floating state are substantially the same timing. Here, an error of, for example, a maximum of 2 μs is allowed for the term of "the same timing".

1.3 Effects According to this Embodiment

As described above, in a case of the semiconductor memory device according to this embodiment, it is possible to reduce power consumption. This effect will be described below.

In a case of a configuration according to this embodiment, some bit lines BL are in an electrically floating state during a programming operation. A bit line BL to be in a floating state is a bit line that does not substantially contribute to data writing. The meaning of not substantially contributing to data writing is as follows.

For example, in FIG. 8, a bit line BL ("G") is selected for illustration. The "G" level is the highest threshold voltage value among possible threshold voltage values of a memory cell transistor MT that holds three bits. Accordingly, it is necessary to inject a large amount of electrons into a charge storage layer by applying a relatively high voltage VPGM. In this regard, in an initial loop such as the first or second loop, a voltage VPGM is set as a low value. This is because a target level due to programming is a threshold distribution having a relatively low voltage such as the "A" level or the "B" level. Such a fluctuation in the threshold voltage value due to programming using a low voltage VPGM is an almost negligible degree as compared with a fluctuation width from the "Er" level to the "G" level. In addition, a fluctuation in the threshold voltage value to the "G" level is substantially performed by, for example, a fourteenth loop and the subsequent loops in which a voltage VPGM is sufficiently increased. This is the above-mentioned meaning of "not substantially contributing to data writing".

Consequently, in this embodiment, in the first to thirteenth loops in which only an almost negligible degree of fluctuation in threshold voltage value occurs, the bit line BL ("G")

is in a floating state. The same is true of the other bit lines BL ("B") to BL ("F") (see FIG. 8). A potential of a bit line BL to be in a floating state increases due to capacity coupling to a surrounding wiring, particularly, a bit line BL.

As a result, it is possible to reduce the number of bit lines BL given '0' data, as compared to a case where '0' data is given to all of the bit lines BL that do not pass verification. In other words, it is possible to reduce a location where a bit line BL given '0' data and a bit line BL given '1' data are adjacent to each other. In other words, it is possible to reduce a difference in potential between bit lines. For this reason, it is possible to reduce power consumption for charging a bit line BL. Further, the number of bit lines BL that are inhibited from writing can be increased, and thus it is possible to reduce a charging current at the time of charging a non-selected word line WL to a voltage VPASS.

As described above, as a result of being able to reduce power consumption at the time of charging a bit line BL and a word line WL, it is also possible to improve charging speeds of the wirings and to increase the speed of a writing operation of the NAND-type flash memory.

2. Second Embodiment

Next, a semiconductor memory device according to a second embodiment will be described. This embodiment relates to details of the sense amplifier 4 in the first embodiment described above. Hereinafter, only differences from the first embodiment will be described.

2.1 Configuration of Sense Amplifier 4

Figure 11:
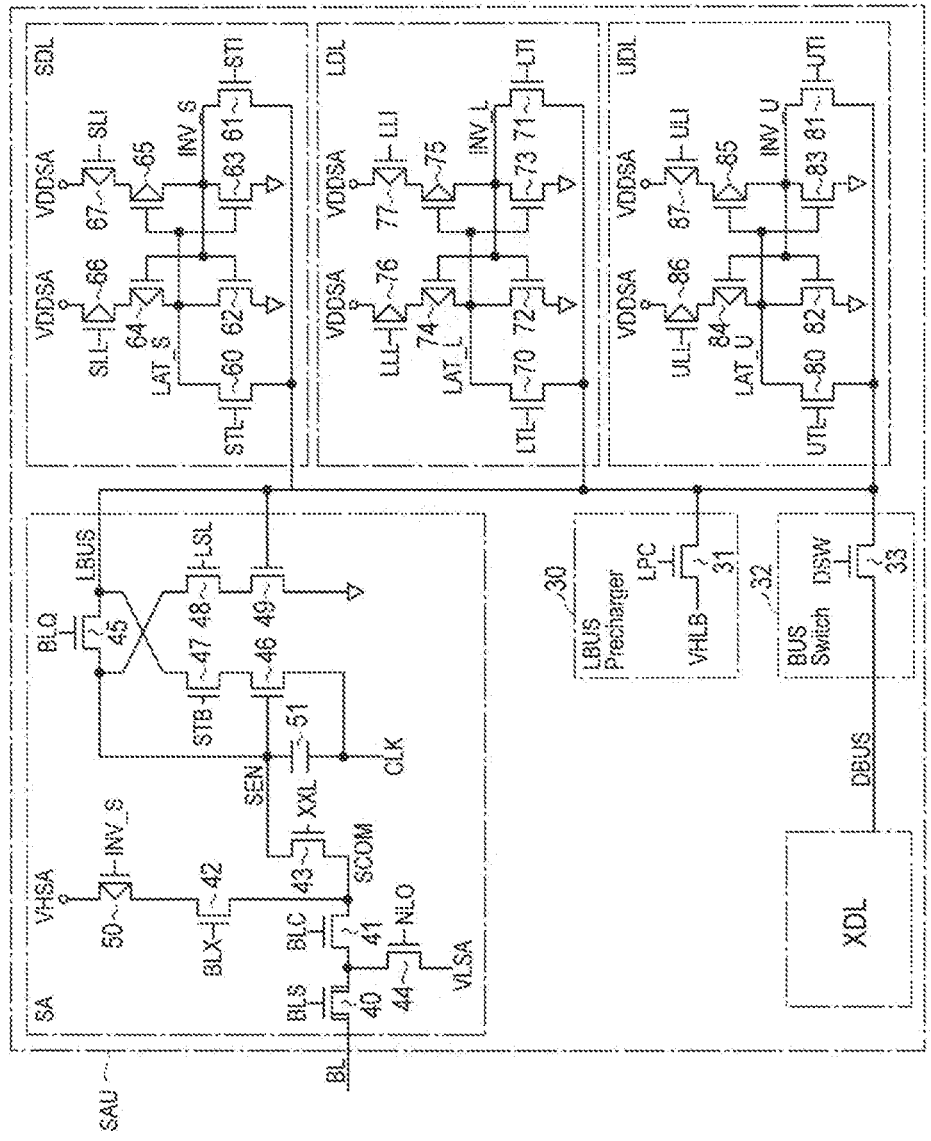
FIG. 11 is a circuit diagram of a sense amplifier unit included in a semiconductor memory device according to a second embodiment.

A sense amplifier 4 includes a sense amplifier unit SAU provided for each bit line BL. FIG. 11 is a circuit diagram of one sense amplifier unit SAU.

As shown in the drawing, the sense amplifier unit SAU includes a sense amplifier section SA, four latch circuits SDL, LDL, UDL, and XDL, a precharge circuit 30, and a bus switch 32.

The sense amplifier section SA senses data which is read out to a bit line BL, and applies a voltage to the bit line BL in accordance with programming data. That is, the sense amplifier section SA is a module that directly controls a bit line BL. Further, the sense amplifier unit is a module that performs an arithmetic operation using data in the latch circuits SDL, UDL, and LDL. Data transmission and reception between the latch circuits SDL, UDL, and LDL are performed through the sense amplifier section SA.

As shown in the drawing, the sense amplifier section SA includes a high breakdown voltage n-channel MOS transistor 40, low breakdown voltage n-channel MOS transistors 41 to 49, a low breakdown voltage p-channel MOS transistor 50, and a capacitor element 51.

In the transistor 40, a signal BLS is applied to a gate, and one end of a current path is connected to the corresponding bit line BL. In the transistor 41, one end of a current path is connected to the other end of the current path of the transistor 40, a signal BLC is applied to a gate, and the other end of the current path is connected to a node SCOM. The transistor 41 clamps the corresponding bit line BL to a potential according to the signal BLC.

In the transistor 44, one end of a current path is connected to connection nodes of the transistors 40 and 41, a voltage VLSA is applied to the other end thereof, and a signal NLO is given to a gate. In the transistor 42, one end of a current path is connected to a node SCOM, and a control signal BLX is input to a gate. In the transistor 50, one end of a current path is connected to the other end of the current path of the transistor 42, a power supply voltage VHSA is given to the other end thereof, and a gate is connected to a node INV_S. In the transistor 43, one end of a current path is connected to a node SCOM, the other end thereof is connected to a node SEN, and a control signal XXL is input to a gate. In the capacitor element 52, one electrode is connected to the node SEN, and a clock CLK is input to the other electrode. In the transistor 46, a clock CLK is input to one end of a current path, and a gate is connected to the node SEN. In the transistor 47, one end of a current path is connected to the other end of a current path of the transistor 46, the other end thereof is connected to a bus LBUS, and a control signal STB is input to a gate.

In the transistor 45, one end of a current path is connected to the node SEN, the other end thereof is connected to the bus LBUS, and a control signal BLQ is input to a gate. In the transistor 49, one end of a current path is grounded, and a gate is connected to the bus LBUS. In the transistor 48, one end of a current path is connected to the other end of the current path of the transistor 49, the other end thereof is connected to the node SEN, and a signal LSL is input to a gate.

The latch circuits SDL, UDL, and LDL temporarily hold data. During data writing, the sense amplifier section SA controls a bit line BL in accordance with the data held in the latch circuit SDL among the three latch circuits. In the other latch circuits UDL and LDL, the respective memory cell transistors perform a multi-value operation of holding data of 2 bits or more or a so-called quick pass writing operation.

The latch circuit SDL includes low breakdown voltage n-channel MOS transistors 60 to 63 and low breakdown voltage p-channel MOS transistors 64 to 67.

In the transistor 60, one end of a current path is connected to the bus LBUS, the other end there of is connected to a node LAT_S, and a control signal STL is input to a gate. In the transistor 61, one end of a current path is connected to the bus LBUS, the other end thereof is connected to a node INV_S, and a control signal STI is input to a gate. In the transistor 62, one end of a current path is grounded, the other end thereof is connected to the node LAT_S, and a gate is connected to the node INV_S. In the transistor 63, one end of a current path is grounded, the other end thereof is connected to the node INV_S, and a gate is connected to the node LAT_S. In the transistor 64, one end of a current path is connected to the node LAT_S, and a gate is connected to the node INV_S. In the transistor 65, one end of a current path is connected to the node INV_S, and a gate is connected to the node LAT_S. In the transistor 66, one end of a current path is connected to the other end of the current path of the transistor 64, a power supply voltage VDDSA is applied to the other end thereof, and a signal SLL is input to a gate. In the transistor 67, one end of a current path is connected to the other end of the current path of the transistor 65, a power supply voltage VDDSA is applied to the other end thereof, and a control signal SLI is input to a gate.

In the latch circuit SDL, a first inverter includes the transistors 62 and 64, and a second inverter includes the transistors 63 and 65. In addition, an output of the first inverter and an input (node LAT_S) of the second inverter are connected to the bus LBUS through the transistor 60 for data transmission, and an input of the first inverter and an output (node INV_S) of the second inverter are connected to the bus LBUS through the transistor 61 for data transmission. The latch circuit SDL holds data in the node LAT_S, and holds the inverted data thereof in the node INV_S.

The latch circuits LDL and UDL have the same configuration as that of the latch circuit SDL, and thus a description thereof will be omitted here. A reference numeral and signal name of each transistor will be described by being distinguished from those of the latch circuit SDL as in FIG. 11. In addition, in each sense amplifier unit SAU, a sense amplifier section SA and three latch circuits SDL, UDL, and LDL are connected to each other through the bus LBUS so as to be able to transmit and receive data to and from each other.

The precharge circuit 30 precharges the bus LBUS. The precharge circuit 30 includes, for example, a low breakdown voltage n-channel MOS transistor 31 and is configured such that one end of a current path is connected to the bus LBUS, a voltage VHLB is given to the other end thereof, and a control signal LPC is given to a gate. In addition, the precharge circuit 30 transmits the voltage VHLB to the bus LBUS, thereby precharging the bus LBUS.

The bus switch 32 connects the bus LBUS and a bus DBUS to each other. That is, the bus switch 32 includes, for example, a low breakdown voltage n-channel MOS transistor 33 and is configured such that one end of a current path is connected to the bus LBUS, the other end there of is connected to the bus DBUS, and a control signal DSW is given to a gate.

A latch circuit XDL is connected to the bus DBUS to transmit and receive data between the sense amplifier unit SAU and the outside. That is, data transmitted from, for example, a controller or the like is first held in the latch circuit XDL, and is then transmitted to any of the latch circuits SDL, LDL, and UDL through the buses DBUS and LBUS, and vice versa. A configuration of the latch circuit XDL is substantially the same as that of the above-mentioned latch circuit SDL, and thus a description thereof will be omitted here.

Meanwhile, various signals in the sense amplifier unit SAU having the above-described configuration are given by, for example, the control circuit 5.

2.2 Operation of Sense Amplifier Unit SAU

Figures 12, 13:
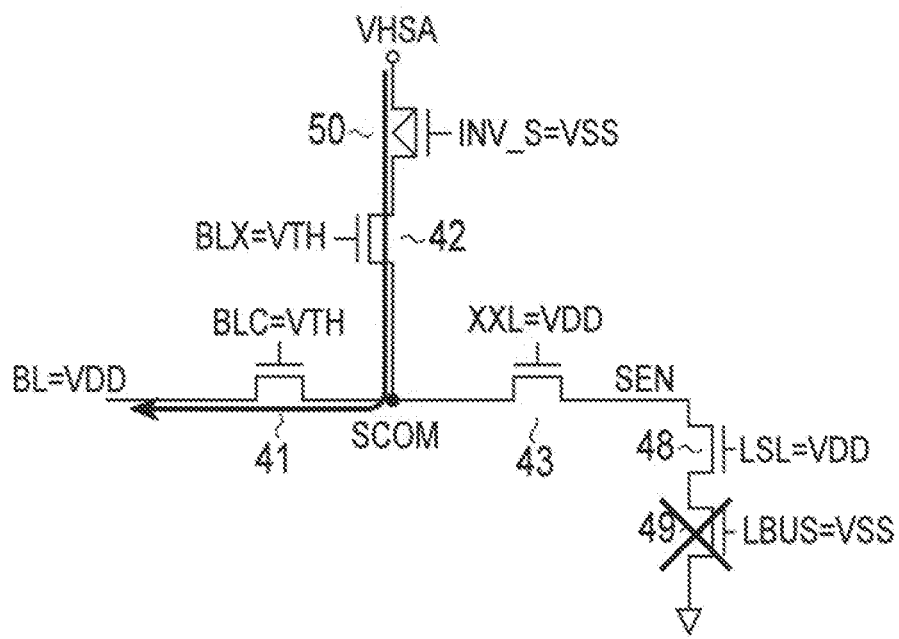
FIG. 12 is a diagram showing state of a latch circuit SDL and a bus LBUS during a writing operation of the semiconductor memory device according to the second embodiment.
FIG. 13 is a circuit diagram of the sense amplifier unit during a writing operation of the semiconductor memory device according to the second embodiment.

Next, the operation of the sense amplifier unit SAU during data writing will be described. FIG. 12 shows data held in the latch circuit SDL and data given to the bus LBUS in a case of '1' writing, a case of '0' writing, a case where a bit line is in a floating state, and a case of a quick pass write operation.

Case of '1' Writing

First, a case of '1' writing will be described. As shown in FIG. 12, when '1' writing is performed, '1' data is held in the latch circuit SDL. That is, the relations of node LAT_S="H" level and INV_S="L" level are established. In addition, '0' data is given to the bus LBUS. That is, the relation of LBUS="L" level is established.

The operation of the sense amplifier section SA at this time is shown in FIG. 13. As shown in the drawing, the transistors 41 to 43, 48, and 50 are in an on state, and the transistor 49 is in an off state. Accordingly, a bit line BL is charged to, for example, a positive voltage VDD (for example, 2.5 V described in FIG. 5 in the first embodiment) by a path from the transistor 50 to the bit line BL.

Case of '0' Writing

Next, a case of '0' writing will be described. As shown in FIG. 12, when '0' writing is performed, '0' data is held in the latch circuit SDL. That is, the relations of node LAT_S="L" level and INV_S="H" level are established. In addition, '1' data is given to the bus LBUS. That is, the relation of LBUS="H" level is established.

Figure 14:
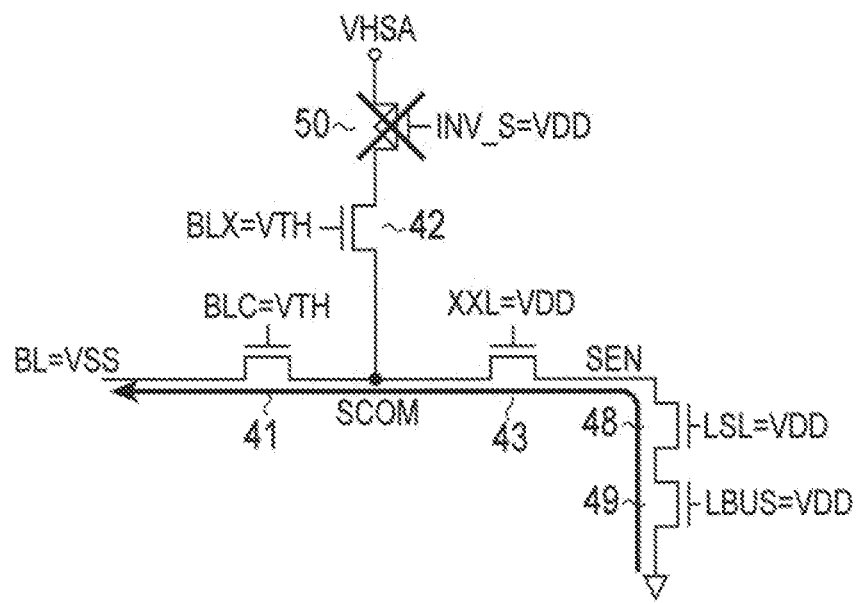
FIG. 14 is a circuit diagram of the sense amplifier unit during a writing operation of the semiconductor memory device according to the second embodiment.

The operation of the sense amplifier section SA at this time is shown in FIG. 14. FIG. 14 is different from FIG. 13 in that the transistor 50 is in an off state and the transistor 49 is in an on state. Accordingly, a potential of a bit line BL is set as, for example, VSS (for example, 0 V described in FIG. 5 in the first embodiment) by a path from the transistor 49 to the bit line BL.

Case of Quick Pass Write Operation

Next, a case of a quick pass write operation will be described. The quick pass write operation performs '0' writing as described in FIG. 14 when a threshold voltage value of a memory cell transistor MT which is a target for writing is sufficiently lower than a target level, that is, while the threshold voltage value is less than a first verification voltage. In addition, the quick pass write operation is a method of increasing the voltage of a bit line BL after the threshold voltage value reaches the first verification voltage or higher, and performing writing using a second verification voltage equivalent to a target level which is the final target. The voltage of the bit line BL is increased to reduce a fluctuation range of the threshold voltage value of the memory cell transistor MT, thereby allowing a threshold distribution to be controlled with a high level of accuracy. Hereinafter, for convenience of description, a description will be given on the assumption that an operation after the threshold voltage value of the memory cell transistor MT reaches the first verification voltage or higher is a quick pass write operation.

As shown in FIG. 12, in the quick pass write operation, '0' data is held in the latch circuit SDL, and '1' data is given to the bus LBUS. These conditions are the same as those in the case of '0' writing.

The quick pass write operation is different from '0' writing in terms of the potential of a signal BLC. That is, the potential of the signal BLC during the quick pass write operation is set to be lower than that during '0' writing. Thus, the amount of current flowing to the transistor 49 from the bit line BL is suppressed, and the potential of the bit line BL is set as, for example, a value between VDD (for example, 2.5 V) and VSS (for example, 0 V).

Case where Bit Line is in Floating State

Next, a case where a bit line BL is in a floating state will be described. In this case, as shown in FIG. 12, '0' data is held in the latch circuit SDL, and the relations of node LAT_S="L" level and INV_S="H" level are established. In addition, '0' data is also given to the bus LBUS, and the relation of LBUS="L" level is established.

Figure 15:
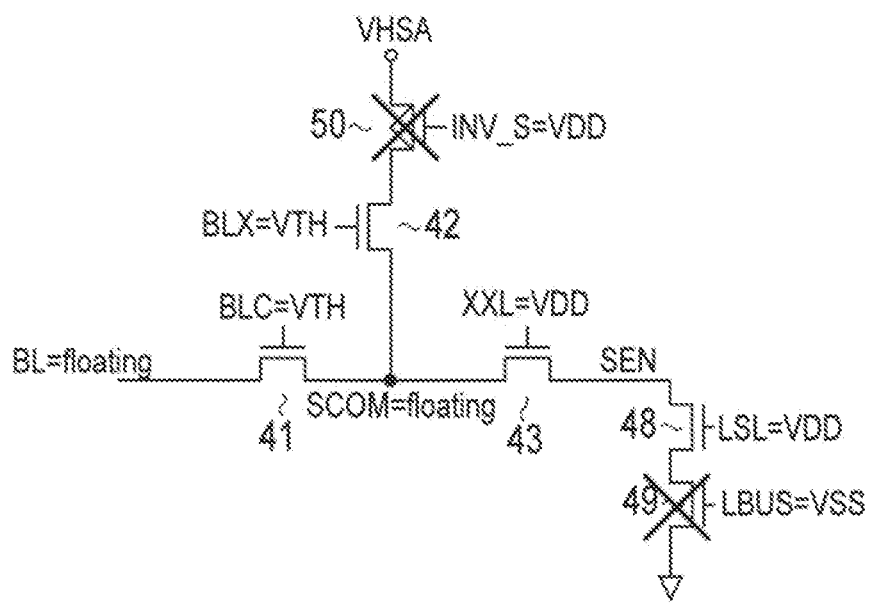
FIG. 15 is a circuit diagram of the sense amplifier unit during a writing operation of the semiconductor memory device according to the second embodiment.

The operation of the sense amplifier section SA at this time is shown in FIG. 15. As shown in FIG. 15, in this case, both the transistors 49 and 50 are in an off state. That is, a node SCOM is not connected to either a power-supply potential or a ground potential, and is in an electrically floating state. As a result, a bit line BL is also in an electrically floating state.

2.4 Specific Example of Operation of Sense Amplifier Unit SAU

Next, a specific example of the operation of the sense amplifier unit SAU during data writing will be described with reference to FIGS. 16 to 21 particularly focusing on an operation for obtaining conditions of FIG. 12 (a description of a quick pass write operation will be omitted). FIGS. 16 to 21 are block diagrams of the sense amplifier unit SAU.

Hereinafter, for simplification of description, a case where each of the memory cell transistors MT holds 2-bit data will be described as an example. Threshold distributions of the memory cell transistors MT holding 2-bit data are an "E" level, an "A" level, a "B" level, and a "C" level in ascending order. In addition, a case where writing target levels of four bit lines BL0 to BL3 are an "E" level, an "A" level, a "B" level, and a "C" level will be described as an example. In addition, sense amplifier units SAU respectively corresponding to the bit lines BL0 to BL3 will be referred to as SAU0 to SAU3, respectively.

Figure 16:
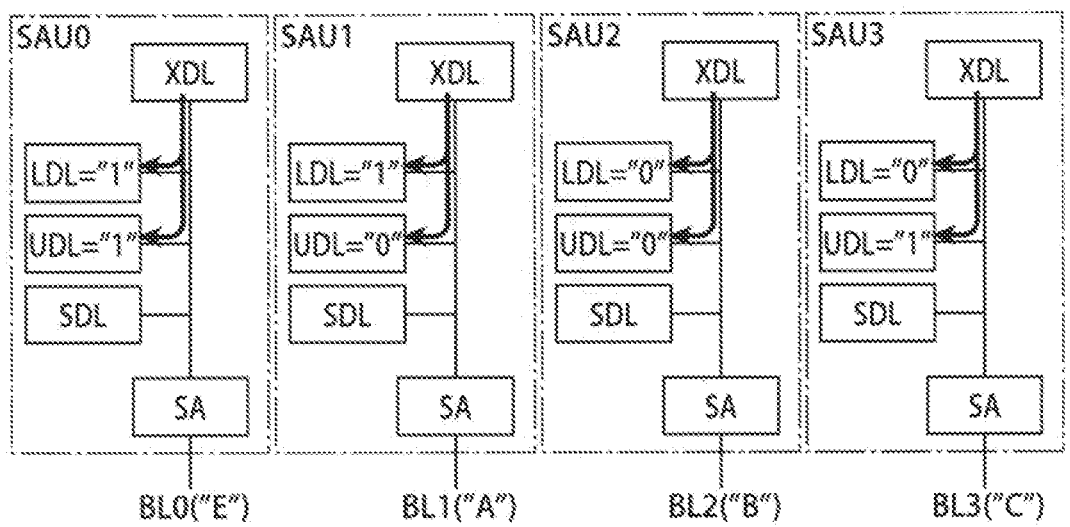
FIG. 16 is a block diagram of the sense amplifier unit during a writing operation of the semiconductor memory device according to the second embodiment.

First, as shown in FIG. 16, programming data (2-bit data) is transmitted to latch circuits XDL of the respective sense amplifier units SAU0 to SAU3 from a controller. In addition, a high-order bit of the programming data within the latch circuit XDL is transmitted to a latch circuit UDL through a bus LBUS, and a low-order bit thereof is transmitted to a latch circuit LDL. As a result, '1' data is held in latch circuits UDL and LDL of the sense amplifier unit SAU0. In addition, '0' data is held in a latch circuit UDL of the sense amplifier unit SAU1, and '1' data is held in a latch circuit LDL thereof. Further, '0' data is held in latch circuits UDL and LDL of the sense amplifier unit SAU2. In addition, '1' data is held in a latch circuit UDL of the sense amplifier unit SAU3, and '0' data is held in a latch circuit LDL thereof.

Next, preparation for executing a first writing loop is made. In this example, in a first loop, a BL ("A") is set as a target for '0' writing, and BL ("B") and BL ("C") are in a floating state. That is, as shown in FIG. 17, in a sense amplifier section SA of each of the sense amplifier units SAU0 to SAU3, an AND operation of the data held in the latch circuit LDL and the data held in the latch circuit UDL is performed, and a result of the operation is transmitted to a latch circuit SDL.

More specifically, the bus LBUS is precharged to an "H" level by the precharge circuit 30. Thereafter, signals LTL and UTL are at an "H" level, and thus transistors 70 and 80 are in an on state. As a result, the potentials of nodes LAT_L and LAT_U are output to the bus LBUS. Then, when both the nodes LAT_L and LAT_U are at an "H" level, the bus LBUS maintains the "H" level. On the other hand, when any of the nodes LAT_L and LAT_U is at an "L" level, the potential of the bus LBUS is reduced to an "L" level by transistors 72 or 82. Thus, an AND operation is performed. The potential of the bus LBUS is transmitted to the sense amplifier section SA, and is then transmitted to the latch circuit SDL from the sense amplifier section SA. As a result, '1' data is held in the latch circuit SDL of the sense amplifier unit SAU0, and '0' data is held in the latch circuits SDL of the sense amplifier units SAU1 to SAU3.

Figure 18:
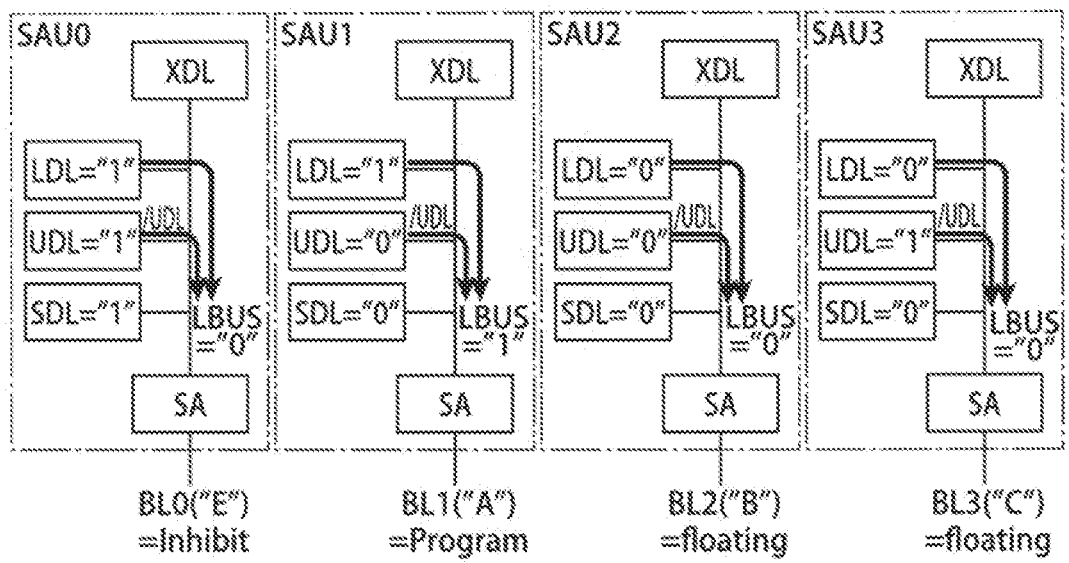
FIG. 18 is a block diagram of the sense amplifier unit during a writing operation of the semiconductor memory device according to the second embodiment.

Next, as shown in FIG. 18, in each of the sense amplifier units SAU0 to SAU3, an AND operation of the data held in the latch circuit LDL and inverted data of the data held in the latch circuit UDL is performed, and a result of the operation is output to the bus LBUS.

Figure 17:
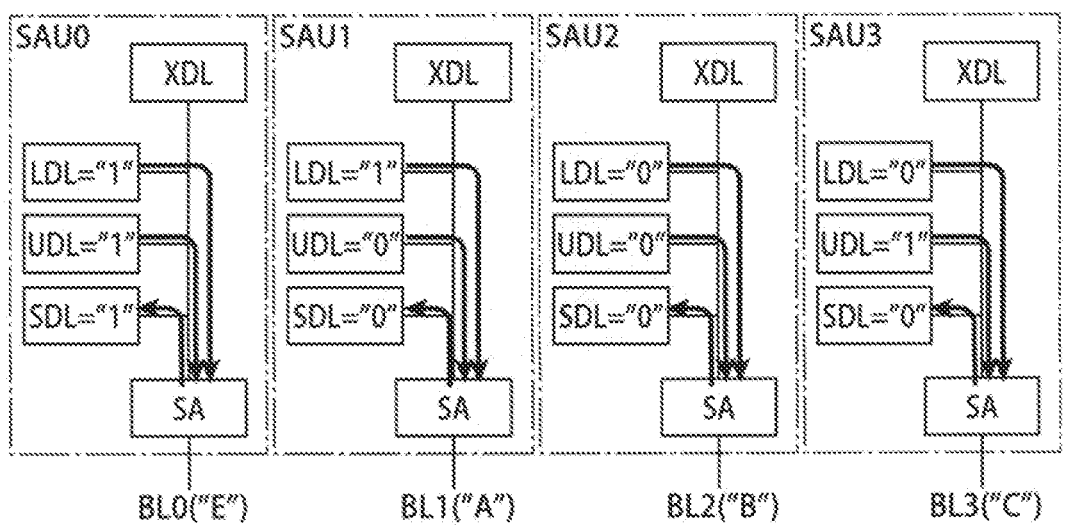
FIG. 17 is a block diagram of the sense amplifier unit during a writing operation of the semiconductor memory device according to the second embodiment.

Such an arithmetic operation method is different from that in FIG. 17 in that a transistor 81 is in an on state by a signal UTI to be at an "H" level rather than by a signal UTL in the latch circuit UDL. Thus, the potential of the node LAT_L and the potential of the node INV_U are output to the bus LBUS which is precharged to an "H" level, and the level of the bus LBUS is a result of an AND operation of both the levels. In addition, data of the bus LBUS is not required to be transmitted to other latch circuits, and thus the sense amplifier section SA may not contribute to this operation.

According to the above-mentioned result, in the sense amplifier unit SAU0, the relations of SDL='1' and LBUS='0' are established, and thus bit line BL0 is inhibited from writing. In addition, in the sense amplifier unit SAU1, the relations of SDL='0' and LBUS='1' are established, and the bit line BL1 is set as a target for '0' writing. In addition, in the sense amplifier units SAU2 and SAU3, the relations of SDL='0' and LBUS='0' are established, and the bit lines BL2 and BL3 are in a floating state.

Figure 19:
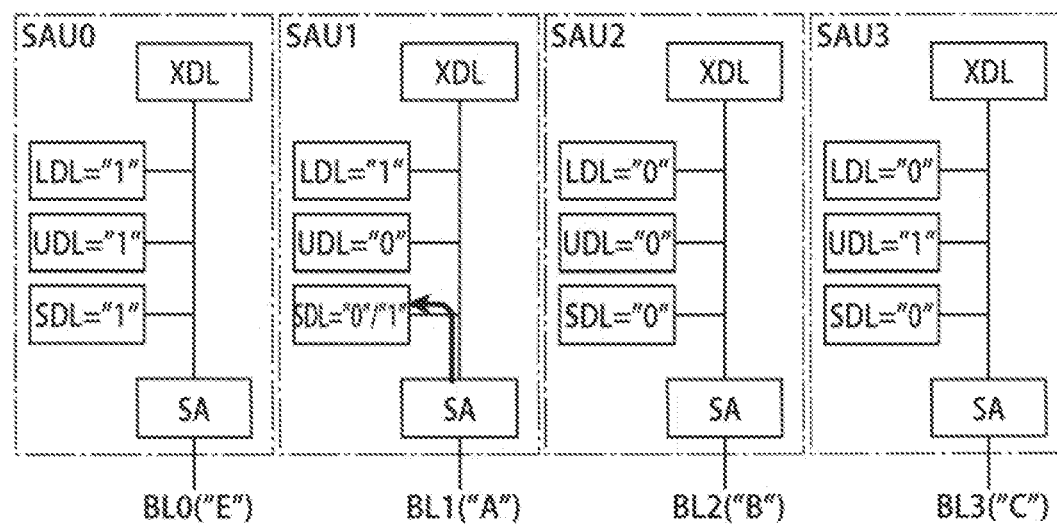
FIG. 19 is a block diagram of the sense amplifier unit during a writing operation of the semiconductor memory device according to the second embodiment.

FIG. 19 shows a state where a programming operation is performed based on the result of FIG. 18, and subsequently, a verification operation for an "A" level is performed. As shown in the drawing, a target for verification is the bit line BL1. Accordingly, in the sense amplifier unit SAU1, a result of the verification in the sense amplifier section SA is transmitted to the latch circuit SDL. That is, when the bit line passes the verification, the relation of SDL='1' is established. When the verification fails, the relation of SDL='0' is established. In addition, in the sense amplifier unit SAU0 corresponding to the bit line BL0 which is inhibited from writing, the relation of SDL='1' is maintained. In addition, in the sense amplifier units SAU2 and SAU3 which are not targets for verification, the relation of SDL='0' is maintained. Meanwhile, the latch circuits LDL and UDL are maintained in the state described in FIG. 18.

Next, preparation for executing a second writing loop is made. In this example, a case where the BL ("A") is set as a target for '0' writing in accordance with a verification result and the BL ("B") and the BL ("C") are in a floating state in a first loop will be described as an example. That is, as shown in FIG. 20, in the sense amplifier section SA of each of the sense amplifier units SAU0 to SAU3, an AND operation of data held in the latch circuit LDL and data held in the latch circuit SDL is performed, and a result of the operation is held in the bus LBUS.

Figure 20:
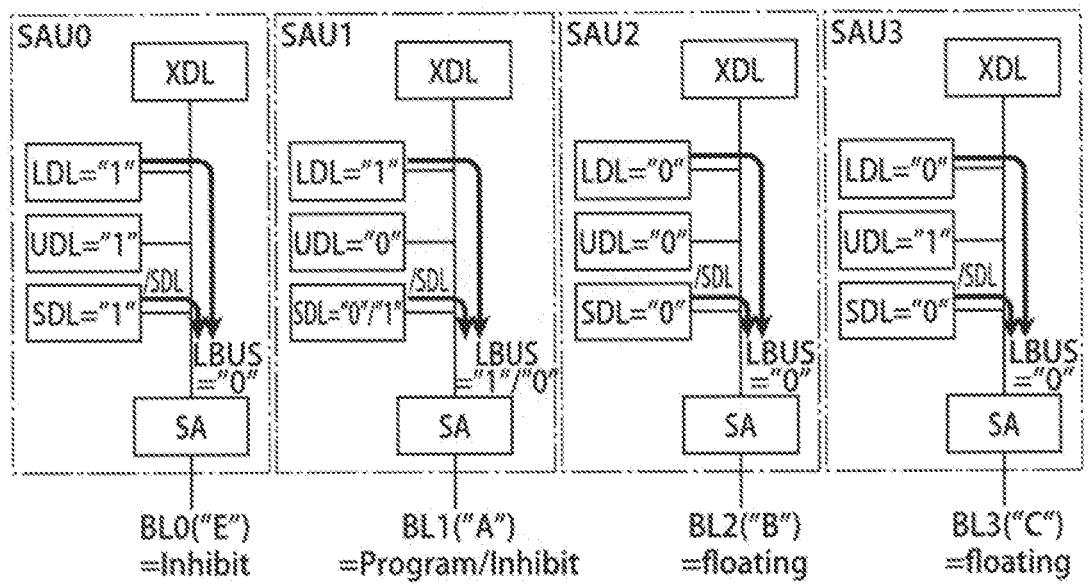
FIG. 20 is a block diagram of the sense amplifier unit during a writing operation of the semiconductor memory device according to the second embodiment.

This operation is substantially the same as in FIG. 18, but is different from the operation in that a signal STI is at an "H" level in FIG. 20, and thus the potential of the node INV_S is output to the bus LBUS. As a result, in the sense amplifier unit SAU0, the relations of SDL='1' and LBUS='0' are established, and the bit line BL0 is inhibited from writing. In addition, in the sense amplifier unit SAU1, the relations of SDL='0' and LBUS='1' or '0' are established, and the bit line BL0 is inhibited from writing when the bit line passes verification, and is set as a target for '0' writing verification fails. In addition, in the sense amplifier units SAU2 and SAU3, the relations of SDL='0' and LBUS='0' are established, and the bit lines BL2 and BL3 are in a floating state.

Figure 21:
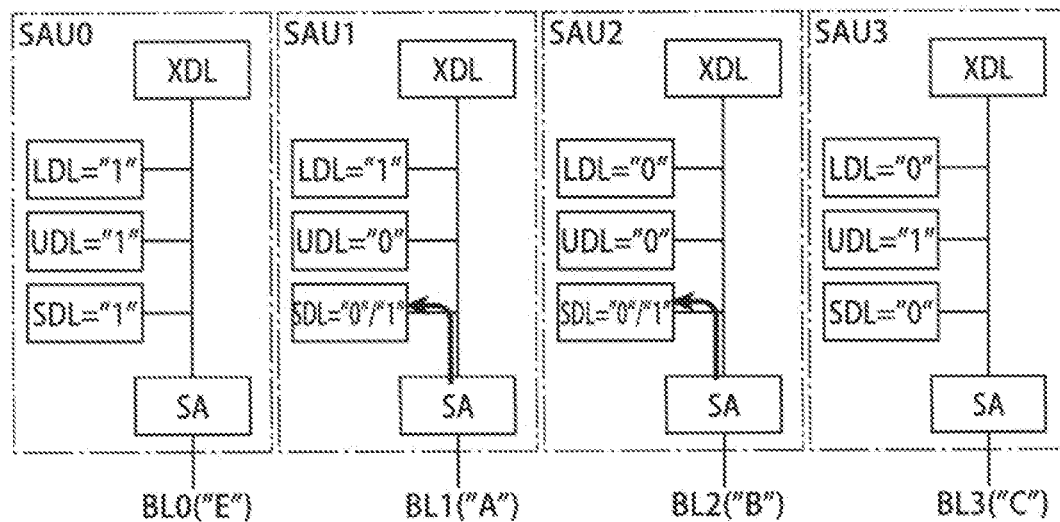
FIG. 21 is a block diagram of the sense amplifier unit during a writing operation of the semiconductor memory device according to the second embodiment.

Thereafter, a programming operation and a verification operation are performed, and a verification result is transmitted to the latch circuit SDL similar to FIG. 19. In a third loop, not only the bit line BL ("A") but also the bit line BL ("B") are set as targets for '0' writing. At this time, results of an AND operation of data held in the latch circuit UDL and inverted data of data held in the latch circuit SDL are output to the bus LBUS. In addition, a programming operation is performed based on data of SDL and LBUS in this state. Thereafter, as shown in FIG. 21, results of "A" verification and "B" verification are transmitted to the latch circuit SDL.

Hereinafter, writing for a "C" level is similarly performed.

2.4 Effects According to this Embodiment

As described above, the writing operation described in the first embodiment can be achieved by the operation of the sense amplifier 4 described in this embodiment. Meanwhile, the specific operations in each sense amplifier unit SAU which are described in this embodiment are just examples, and such an arithmetic operation method is not limited insofar as the conditions described in FIG. 12 can be achieved.

3. Third Embodiment

Next, a semiconductor memory device according to a third embodiment will be described. This embodiment relates to a modification example of FIG. 8 described in the first embodiment described above. Hereinafter, only differences from the first embodiment will be described.

3.1 First Example

FIG. 22 corresponds to FIG. 8 described in the first embodiment, and shows the state of a bit line according to a target level of a threshold voltage value in each loop.

This example is different from the pattern of FIG. 8 in that bit lines BL ("E"), BL ("F"), and BL ("G") corresponding to a memory cell transistor MT in which target levels of a threshold voltage value is an "E" level, an "F" level, and a "G" level are temporarily set as targets for writing inhibition ('1' programming) before '0' programming is performed.

That is, the bit line BL ("E") is in a floating state in first to sixth loops, and is inhibited from writing in seventh and eighth loops. The bit line BL ("F") is in a floating state in the first to sixth loops, and is inhibited from writing in the seventh to tenth loops. In addition, the bit line BL ("G") is in a floating state in the first to sixth loops, and is inhibited from writing in the seventh to thirteenth loops.

3.2 Second Example

FIG. 23 shows a second example. As shown in the drawing, in this example, the bit lines BL ("E"), BL ("F"), and BL ("G") that are inhibited from writing in the seventh to thirteenth loops in FIG. 22 are set as targets for '0' programming.

3.3 Third Example

FIG. 24 shows a third example. As shown in the drawing, in this example, conditions in which the bit line BL is in a floating state and conditions in which the bit line BL is set as a target for '0' writing in the second example described in FIG. 23 are replaced with each other.

That is, a bit line BL ("B") is set as a target for '0' writing in first and second loops, a bit line BL ("C") is set as a target for '0' writing in the first to fourth loops, and a bit line BL ("D") is set as a target for '0' writing in the first to sixth loops. In addition, the bit line BL ("E") is set as a target for '0' writing in the first to sixth loops and is in a floating state in seventh and eighth loops, the bit line BL ("F") is set as a target for '0' writing in the first to sixth loops and is in a floating state in the seventh to tenth loops, and the bit line BL ("G") is set as a target for '0' writing in the first to sixth loops and is in a floating state in the seventh and thirteenth loops.

3.4 Fourth Example

FIG. 25 shows a fourth example. As shown in the drawing, in this example, the bit lines BL ("B"), BL ("C"), BL ("D"), BL ("E"), BL ("F"), and BL ("G") that are set as targets for '0' writing in the first to sixth loops in FIG. 24 are inhibited from writing.

3.5 Fifth Example

FIG. 26 shows a fifth example. As shown in the drawing, in this example, an intermediate voltage Vmid is applied to a bit line BL instead of setting the bit line BL to be in a floating state in FIG. 8 described in the first embodiment. For example, Vmid is a voltage having an intermediate value between a voltage VSS (for example, 0 V) corresponding to '0' data and a voltage VDD (for example, 2.5 V) corresponding to '1' data.

Meanwhile, the fifth example can also be applied to the first to fourth examples described above. That is, in FIGS. 22 to 25, an intermediate voltage Vmid may be applied, instead of setting a bit line BL to be in a floating state.

3.6 Effects According to this Embodiment

In this embodiment, some data patterns different from those in FIG. 8 described in the first embodiment are described, but the same effects as those in the first embodiment are obtained even with data patterns according to this embodiment.

For example, in the first example described with reference to FIG. 22, '1' data is given to a large number of bit lines BL in the seventh to thirteenth loops, and thus it is possible to relatively reduce the number of bit lines BL given '0' data. In contrast, in the second example, '0' data is given to a large number of bit lines BL in the seventh to thirteenth loops, and thus it is possible to relatively reduce the number of bit lines BL given '1' data.

In addition, in the third example described with reference to FIG. 24, '0' data is given to a large number of bit lines BL in the first to sixth loops, and thus it is possible to relatively reduce the number of bit lines BL given '1' data. In contrast, in the fourth example, '1' data is given to a large number of bit lines BL in the first to sixth loops, and thus it is possible to relatively reduce the number of bit lines BL given '0' data.

Further, in the fifth example described with reference to FIG. 26, an intermediate voltage Vmid is applied to a bit line BL, and thus it is possible to reduce a difference in potential which is generated between bit lines.

Meanwhile, the method described in the second embodiment can be applied to the operation of the sense amplifier 4 for obtaining the data patterns described in this embodiment, and thus a detailed description thereof will be omitted.

4. Fourth Embodiment

Next, a semiconductor memory device according to a fourth embodiment will be described. Similarly to the third embodiment described above, this embodiment relates to a modification example of FIG. 8 described in the first embodiment. Hereinafter, only differences from the first and second embodiments will be described.

4.1 Data Pattern

Data patterns according to this embodiment are shown in FIG. 27. FIG. 27 corresponds to FIG. 22 described in first embodiment and FIGS. 22 to 26 described in the third embodiment.

As shown in the drawing, in this example, in the patterns of FIG. 8 described in the first embodiment, '0' data is given to a bit line BL which is a target for floating in first to sixth loops, and '1' data is given thereto in seventh to thirteenth loops (writing inhibition).

That is, a bit line BL ("B") is set as a target for '0' writing in the first and second loops, a bit line BL ("C") is set as a target for '0' writing in the first to fourth loops, and a bit line BL ("D") is set as a target for '0' writing in the first to sixth loops. In addition, a bit line BL ("E") is set as a target for '0' writing in the first to sixth loops and is set as a target for '1' writing in seventh and eighth loops, a bit line BL ("F") is set as a target for '0' writing in the first to sixth loops and is set as a target for '1' writing in the seventh to tenth loops, and a bit line BL ("G") is set as a target for '0' writing in the first to sixth loops and is set as a target for '1' writing in the seventh to thirteenth loops.

Figure 28:
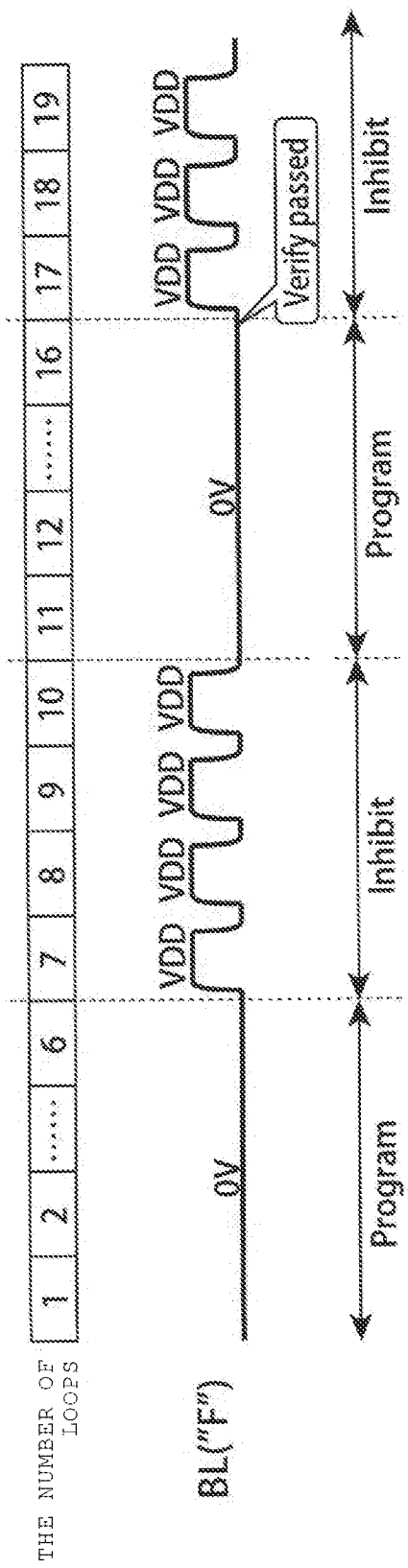
FIG. 28 is a schematic diagram showing changes in a bit line voltage during a programming operation of the semiconductor memory device according to the fourth embodiment.

In other words, in a bit line BL corresponding to a memory cell transistor MT in which a threshold voltage value level has to be increased to a high level, '0' writing is performed at an initial stage of a writing loop, writing is inhibited at a certain stage, '0' writing is performed again, and thereafter, the bit line passes verification, thereby inhibiting the bit line from writing. In other words, two '0' writing operations are performed with a writing inhibition period therebetween. Here, a threshold voltage value substantially fluctuates due to the two writing operations, and is set to be at a threshold voltage value level as a target. This state is shown in FIG. 28. FIG. 28 shows fluctuations in the potential of a bit line BL ("F") during a programming operation (a verification operation period is not shown in the drawing).

As shown in the drawing, in the first to sixth loops, the potential of the bit line BL ("F") is maintained at 0 V, and '0' data is written. In other words, charge is injected into a charge storage layer. In this stage, a threshold voltage value of a memory cell in which writing is performed at an "F" level is shifted in the same manner as a memory cell in which writing is performed at any of other threshold voltage value level, and thus does not reach farther than a target threshold voltage value. Therefore, a verification operation with respect to the "F" level is not necessary.

Thereafter, in the seventh to tenth loops, the potential of the bit line BL ("F") is set as VDD, and thus writing is inhibited. This is control for suppressing the amount of charge with which bit lines of the entire cell array are charged. A memory cell in which writing is performed at an "F" level is set on the assumption that even when, for example, approximately three loops are switched to a writing inhibition state, the subsequent writing speed is not greatly affected.

Thereafter, in the seventh to tenth loops, the potential of the bit line BL ("F") is set as VDD, and thus writing is inhibited.

Thereafter, the potential of the bit line BL ("F") is set as 0 V again from the eleventh loop, '0' data is written. During this period, a verification operation with respect to an "F" level is also performed after a programming operation is performed, and a writing operation targeted at an "F" level is actually performed.

In the example of FIG. 28, the bit line passes verification in a sixteenth loop. Therefore, VDD is applied to the bit line BL ("F") again in a seventeenth loop and the subsequent loops, and thus the bit line is inhibited from writing.

4.2 Effects According to this Embodiment

According to the configuration of this embodiment, similarly to the first embodiment, it is possible to reduce the power consumption of the semiconductor memory device. These effects will be described in detail below.

Figure 29:
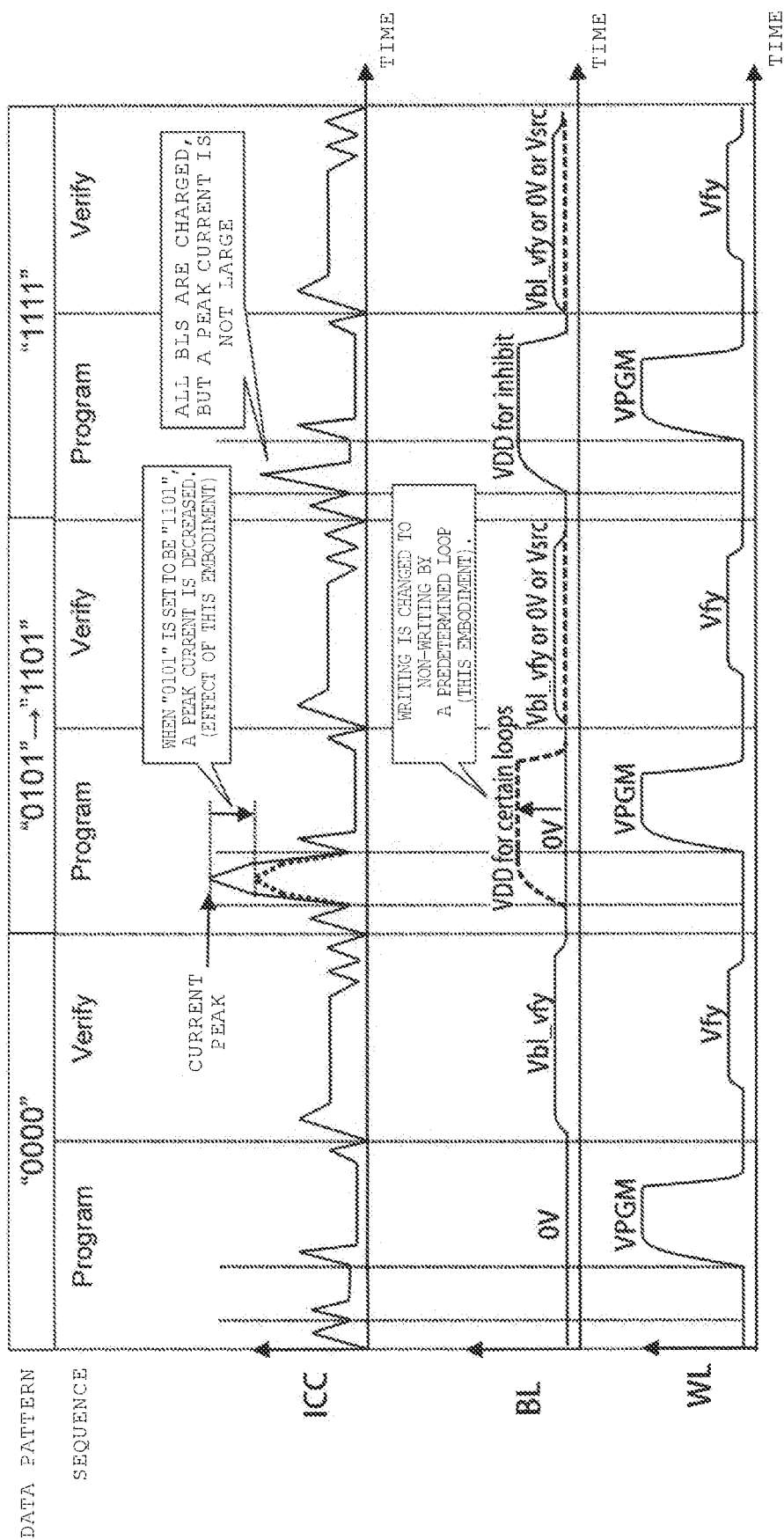
FIG. 29 is a schematic diagram showing changes in current consumption, a word line voltage, and a bit line voltage during a writing operation of the semiconductor memory device according to the fourth embodiment.

FIG. 29 is a schematic timing chart showing three types of data patterns, a current ICC that flows to the semiconductor memory device during programming and verification at the time of writing the data patterns, a voltage of a selected word line WL, and a voltage of a bit line BL. For example, the current ICC is a current flowing to an output terminal of a power supply voltage generation circuit which is provided in the semiconductor memory device.

When a data pattern is "0000", that is, when the same data is given to all bit lines BL, a difference in potential between the bit lines is barely generated. Accordingly, the current ICC is small. On the other hand, when a data pattern is "1111", that is, when '1' data is given to almost all the bit lines BL, the bit lines are charged with VDD. Accordingly, although a bit line charging current is increased during writing, there is no potential difference between the bit lines, and thus a very large peak current is not generated. In addition, when a data pattern is "0101", that is, when the number of bit lines BL given '0' data and the number of bit lines BL given '1' data are equal to each other, charging capacitance between the bit lines is maximized, and thus current consumption is significantly increased (is maximized at a point written as a "current peak" in FIG. 29).

However, according to this embodiment, in the case of a data pattern such as "0101", some of the bit lines BL are inhibited from writing as described in FIG. 28. For example, in FIG. 29, "0101" is changed to "1101". Thus, the proportion of '0' data in the data pattern is reduced. Therefore, as indicated by a dashed line in FIG. 29, it is possible to reduce current consumption.

Figure 30:
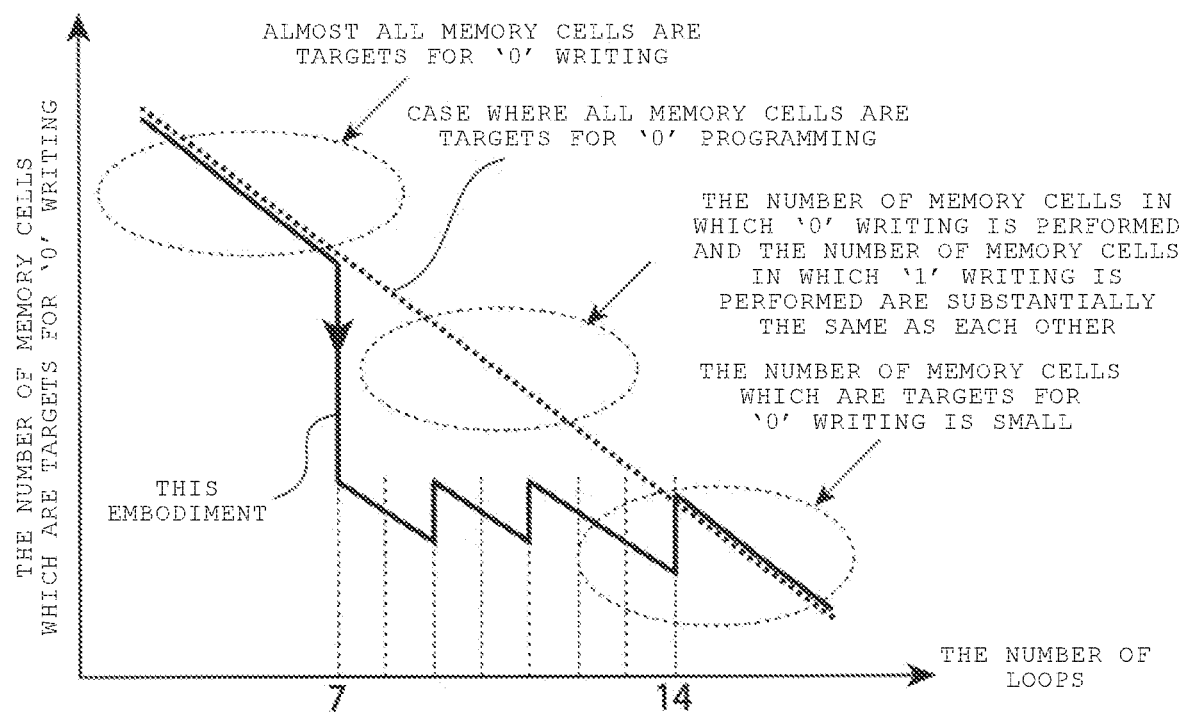
FIG. 30 is a graph showing the number of memory cells which are targets for '0' writing with respect to the number of loops during a writing operation of the semiconductor memory device according to the fourth embodiment.

FIG. 30 is a graph showing a relationship between the number of loops and the number of memory cells which are targets for '0' writing. In FIG. 30, a thick solid line indicates a case of this embodiment, and a thick dashed line indicates a case where a bit line BL is not inhibited from writing before '0' writing (a case where '0' writing is performed even in the seventh to tenth loops in FIG. 28).

As shown in the drawing, at an initial stage of a loop, almost all memory cell transistors MT connected to a selected word line WL are targets for '0' writing. In addition, as the loop number increases, the number of memory cell transistors which are targets for '0' writing decreases. Then, during a certain loop period, the number of memory cell transistors in which '0' writing is performed and the number of memory cell transistors in which '1' writing is performed are the same as each other. As described in FIG. 29, this period is a period in which current consumption is particularly increased.

Consequently, in this embodiment, in the example of FIG. 30, writing for some bit lines BL (in the example of FIG. 27, BL ("E"), BL ("F"), and BL ("G")) is inhibited from a seventh loop. In other words, as shown in FIG. 30, the number of memory cell transistors which are targets for '0' writing is rapidly decreased in the seventh loop. Thereafter, a writing cell for "E" is returned to a target for '0' writing in a ninth loop, a writing cell for "F" is returned to a target for '0' writing in an eleventh loop, and a writing cell for "G" is returned to a target for '0' writing in a fourteenth loop. At this point, there are a large number of memory cell transistors MT that already pass verification, and there are few memory cell transistors which are targets for '0' writing.

In this manner, when focusing on the number of bit lines BL included in a memory cell array, it is possible to reduce current consumption by avoiding the generation of a data pattern in which the number of memory cell transistors which are targets for '0' writing and the number of memory cell transistors which are targets for '1' writing become substantially the same as each other in a process of data wiring.

Figure 31:
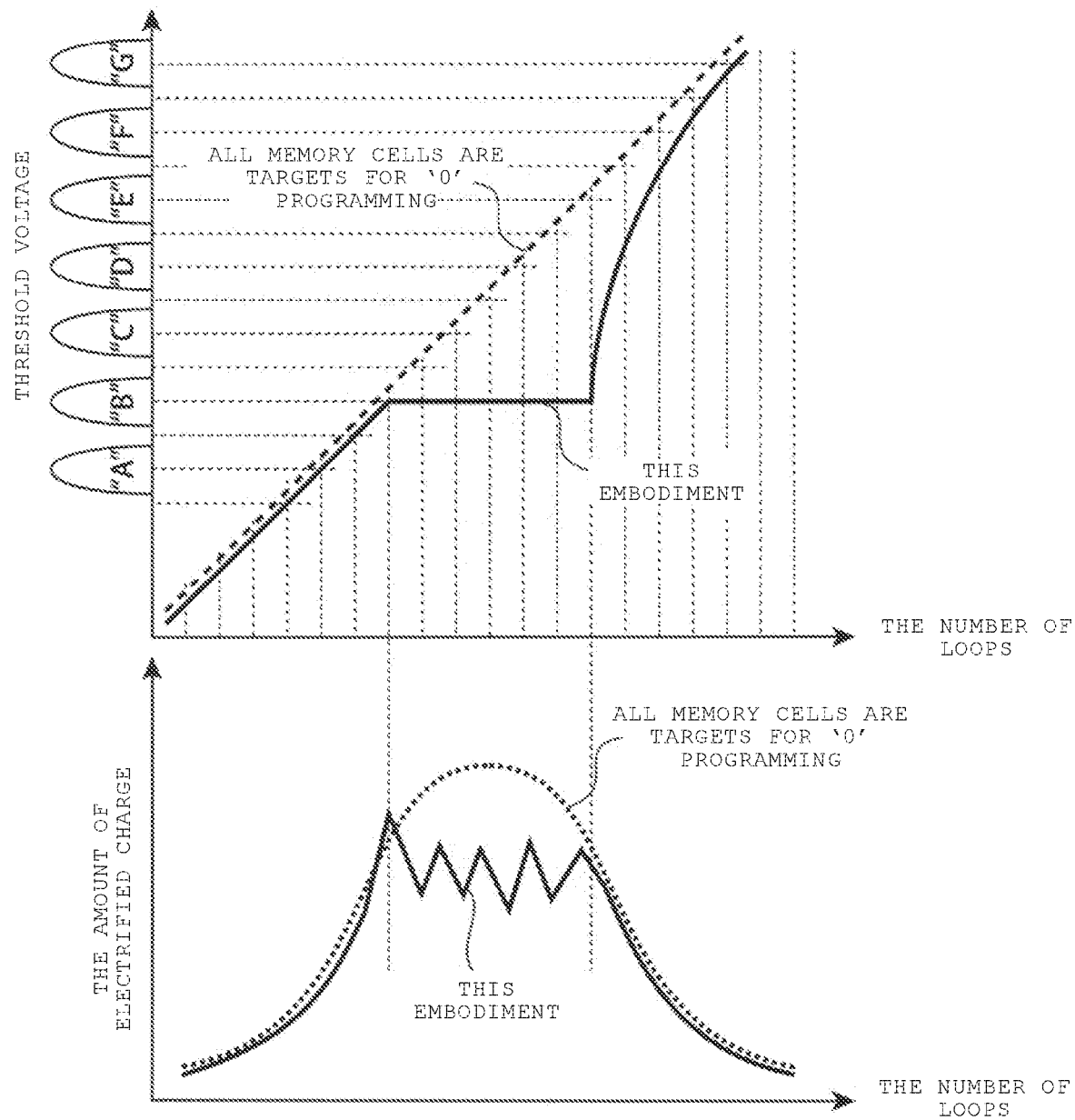
FIG. 31 is a graph showing changes in a threshold voltage and the amount of charged charge with respect to the number of loops during a writing operation of the semiconductor memory device according to the fourth embodiment.

Similarly, changes in a threshold voltage and changes in the amount of charged charge with respect to the number of loops when focusing on one memory cell transistor MT are shown in FIG. 31. In FIG. 31, a case of a memory cell transistor MT connected to the bit line BL ("G") in FIG. 27 is shown as an example.

As shown in the drawing, '1' data is given to the bit line BL ("G") in a seventh loop. Accordingly, a threshold voltage value of the memory cell transistor MT is maintained substantially constant. Thereafter, '0' programming is restarted from a fourteenth loop. At this time, a program voltage VPGM is set as a sufficiently high value, and thus the threshold voltage value of the memory cell transistor MT is rapidly increased up to the vicinity of a "G" level which is a target. In addition, in a seventh to thirteenth loops in which writing is inhibited, a required amount of charged charge is also reduced.

As described above, according to this embodiment, a data pattern is controlled so that the number of figures of '0' and the number of figures of '1' are substantially the same as each other or fall within a range of a fixed ratio in a process of repeating a writing loop. More specifically, a memory cell transistor MT which is a target for '0' writing is inhibited from writing in a certain loop. Thus, a difference between the number of figures of '0' and the number of figures of '1' that are included in a data pattern is equal to or greater than a fixed value, and it is possible to always keep a state where the number of figures of '1' is larger to a certain degree or the number of figures of '0' is larger to a certain degree. As a result, it is possible to reduce the power consumption of the semiconductor memory device.

Meanwhile, the method described in the second embodiment can also be applied to the operation of the sense amplifier 4 for obtaining the data patterns described in this embodiment, and thus a detailed description thereof will be omitted.

5. Fifth Embodiment

Next, a semiconductor memory device according to a fifth embodiment will be described. In this embodiment, the potential of an unselected select-gate line SGD at the final stage of a writing loop is set to be higher than VSS in the first to fourth embodiments described above. Hereinafter, only differences from the first to fourth embodiments will be described.

5.1 Potential During Programming Operation

Figure 32:
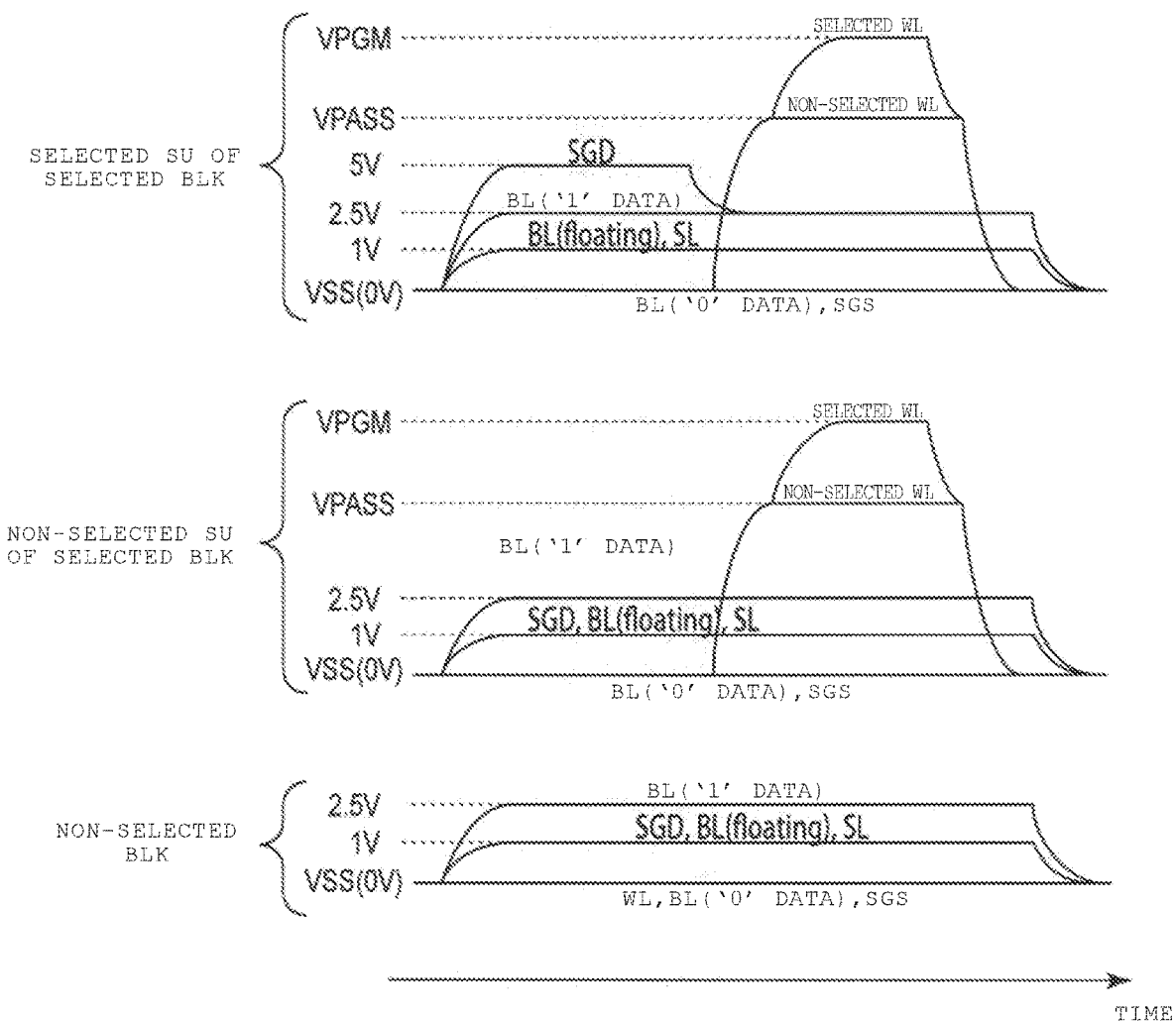
FIG. 32 is a timing chart showing voltages of various wirings during a writing operation of the semiconductor memory device according to a fifth embodiment.

FIG. 32 shows changes in the potential of each wiring during a programming operation at the final stage of a writing loop. As shown in the drawing, FIG. 32 is different from FIG. 5 described in the first embodiment in that the potential of a select-gate line SGD of a non-selected string unit SU in a selected block BLK and the potential of a select-gate line SGD in a non-selected block are set as, for example, approximately 1 V. This value is just an example, and a voltage for cutting off selection transistors ST1 connected to the select-gate lines SGD may be used.

5.2 Effects According to this Embodiment

When a writing loop approaches the final stage, a substantial proportion of memory cell transistors MT pass verification. As a result, '1' data is given to a bit line BL corresponding to the memory cell transistors MT. Then, charging capacitance between the bit line BL and a select-gate line SGD of a non-selected string unit SU is increased as compared with the initial stage of the loop.

Accordingly, in this embodiment, the select-gate line SGD of the non-selected string unit SU is increased within a range in which a selection transistor ST1 can be cut off. Thus, it is possible to decrease charging capacitance and to further reduce power consumption.

6. Modification Example and the Like

As described above, according to the semiconductor memory devices of the above-described embodiments, it is possible to decrease charging capacitance between wirings and to reduce power consumption during a data writing operation.

Meanwhile, the above-described embodiments are not limited to the above-described configurations, and can be modified in various ways. For example, a verification timing of FIG. 7 described in the first embodiment is merely an example, and in which loop and for which level verification is performed is arbitrary. This can be determined in accordance with the magnitude of a program voltage VPGM, characteristics of a memory cell transistor MT, and the like. In addition, in FIGS. 5 and 9 of the first embodiment, a case where the potential of a bit line BL to be in a floating state is approximately 1 V is described as an example. However, this is merely an example, and the potential changes depending on the potential of a surrounding wiring. However, the potential of the bit line BL to be in a floating state is set as a value between a potential corresponding to '0' data and a potential corresponding to '1' data.

In addition, the configuration of the sense amplifier 4 described in the second embodiment is merely an example, and the sense amplifier may have other configurations. In addition, as described in the second embodiment, various methods can be used as a method of performing an arithmetic operation of data in a sense amplifier unit SAU. In addition, as described in FIG. 12, correspondence of '1' data and '0' data to an "L" level and an "H" level is merely an example, and can be appropriately selected. In other words, in a case of the example described in FIG. 12, a case where "L" is held in the node INV and an "H" level is held in the node LAT is defined as a case where "latch circuit holds '1'", but the relationship opposite thereto may be adopted. In addition, a method of setting a bit line BL to be in a floating state is not also limited to the method described in the second embodiment described above, and the transistors 41 and 40 may be cut off by controlling, for example, potentials of the signals BLC and BLS.

Further, in FIGS. 22 to 25 described in the third embodiment, a case where a timing when '1' data or '0' data is given to a bit line BL to be in a floating state and a timing when the bit line BL given '1' data or '0' data is in a floating state are a seventh loop is described as an example. However, this is merely an example, and at which timing the state of the bit line BL is switched is arbitrary. However, as shown in the upper drawing of FIG. 31, there is a statistical correlation between the number of loops and the amount of fluctuation in a threshold voltage. Accordingly, the state of the bit line BL may be switched at an appropriate timing when power consumption can be reduced, based on the correlation. Further, in the third embodiment described above, a case where the state of a bit line BL is switched depending on the number of loops regardless of a target level is described as an example. However, a timing when the state is switched depending on a target level may be changed. For example, in FIG. 22, a bit line BL ("E") may be inhibited from writing from a seventh loop, a bit line BL ("F") may be inhibited from writing from a ninth loop, and a bit line BL ("G") may be inhibited from writing from an eleventh loop. This is the same as in cases of FIGS. 23 to 25. In addition, this is the same as in a case where an intermediate voltage Vmid is given instead of setting a bit line BL to be in a floating state. Further, this is also the same as in a case of FIG. 27 described in the fourth embodiment. That is, in a case of FIG. 27, data given to a bit line BL is switched from '0' to '1' in a seventh loop. However, the embodiment is not limited to the seventh loop, and a switching timing may be changed in accordance with a writing target level.

In addition, the fifth embodiment may be implemented independently of the first to fourth embodiments. Even in this case, it is possible to decrease charging capacitance between a bit line BL and a select-gate line SGD and to reduce power consumption. In addition, from which loop the potential of the select-gate line SGD is increased is arbitrary. The control circuit 5 can recognize the number of bit lines which are targets for '1' writing for each loop. Accordingly, for example, when the control circuit 5 has a threshold voltage value in an internal register or the like and the number of bit lines which are targets for '1' writing exceeds the threshold voltage value, the potential of the select-gate line SGD may be increased. Alternatively, for example, in the cases of FIGS. 22, 24, 27, the potential of the select-gate line SGD may be increased at a timing when '1' data is given to bit lines BL ("E"), BL ("F"), and BL ("G") or a timing when the bit lines are in a floating state. Alternatively, in the case of FIG. 25, the potential of the select-gate line SGD may be increased at the initial stage (first to sixth loops) of a loop rather than at the final stage thereof. This is because, in the case of the example of FIG. 25, '1' data is given to a large number of bit lines (bit lines BL ("B"), BL ("C"), BL ("D"), BL ("E"), BL ("F"), and BL ("G")) at the initial stage of a loop. Needless to say, even in this case, for example, the potential of the select-gate line SGD may be increased at the final stage of a loop such as a fourteenth loop and the subsequent loops. That is, the fifth embodiment is not limited to a case where the potential of the select-gate line SGD is increased at the final stage of a loop. In contrast, the potential may be increased at the initial stage, or the potential may be increased at the initial stage, may be decreased at the middle stage, and may be increased at the final stage again. Needless to say, a combination thereof can be arbitrarily selected according to the state of a bit line BL.

Further, in the above-described embodiments, a NAND-type flash memory having memory cells three-dimensionally stacked therein is described as an example, but the embodiment can also be applied to a flat NAND-type flash memory in which memory cells are two-dimensionally arrayed on a semiconductor substrate. Further, the embodiment can also be applied to an FG type in which a charge storage layer includes a conductive layer, without being limited to a MONOS type in which a charge storage layer is formed of an insulating film.

In addition, when one memory cell transistor MT holds 2-bit data, the threshold voltage thereof takes any one of four types of levels in accordance with the held data. When the four types of levels are an erasure level, an A level, a B level, and a C level in ascending order, a voltage applied to a selected word line during a read-out operation of the A level is in a range of, for example, from 0 V to 0.55 V. The embodiment is not limited thereto, and the voltage may be in any of ranges of from 0.1 V to 0.24 V, from 0.21 V to 0.31 V, from 0.31 V to 0.4 V, from 0.4 V to 0.5 V, from 0.5 V to 0.55 V, and the like. A voltage applied to a selected word line during reading-out of the B level is in a range of, for example, from 1.5 V to 2.3 V. The embodiment is not limited thereto, and the voltage may be in any of ranges of from 1.65 V to 1.8 V, from 1.8 V to 1.95 V, from 1.95 V to 2.1 V, from 2.1 V to 2.3 V, and the like. A voltage applied to a selected word line during a reading operation of the C level is in a range of, for example, from 3.0 V to 4.0 V. The embodiment is not limited thereto, and the voltage may be in any of ranges of from 3.0 V to 3.2 V, from 3.2 V to 3.4 V, from 3.4 V to 3.5 V, from 3.5 V to 3.6 V, from 3.6 V to 4.0 V, and the like. A time (tR) of the reading operation may be in any of ranges of, for example, from 25 µs to 38 µs, from 38 µs to 70 µs, from 70 µs to 80 µs, and the like.

A writing operation includes programming and programming verification. In the writing operation, a voltage which is first applied to a word line selected during programming is in a range of, for example, from 13.7 V to 14.3 V. The embodiment is not limited thereto, and the voltage may be in any of ranges of, for example, from 13.7 V to 14.0 V, from 14.0 V to 14.6 V, and the like. A voltage which is first applied to a selected word line at the time of writing an odd-numbered word line and a voltage which is first applied to a selected word line at the time of writing an even-numbered word line may be differentiated from each other. When a programming operation is an incremental step pulse program (ISPP) method, for example, approximately 0.5 V is adopted as a step-up voltage. A voltage applied to a non-selected word line may be in a range of, for example, from 6.0 V to 7.3 V. The embodiment is not limited thereto, and the voltage may be in a range of, for example, from 7.3 V to 8.4 V or may be equal to or less than 6.0 V. A path voltage to be applied may be made different according to whether a non-selected word line is an odd-numbered word line or an even-numbered word line. A time (tProg) of the writing operation may be in any of ranges of, for example, from 1,700 µs to 1,800 µs, from 1,800 µs to 1,900 µs, and from 1,900 µs to 2,000 µs.

In an erasure operation, a voltage which is first applied to a well which is arranged on a semiconductor substrate and has memory cells arranged thereon is in a range of, for example, from 12 V to 13.6 V. The embodiment is not limited thereto, and the voltage may be in any of ranges of, for example, from 13.6 V to 14.8 V, from 14.8 V to 19.0 V, from 19.0 V to 19.8 V, from 19.8 V to 21 V, and the like. A time (tErase) of the erasure operation may be in any of ranges of, for example, from 3,000 µs to 4,000 µs, from 4,000 µs to 5,000 µs, and from 4,000 µs to 9,000 µs.

In addition, a memory cell may have, for example, the following structure. The memory cell includes a charge storage film which is arranged on a semiconductor substrate such as a silicon substrate through a tunnel insulating film having a film thickness of from 4 nm to 10 nm. The charge storage film can have a structure in which an insulating film such as a silicon nitride (SiN) film having a film thickness of from 2 nm to 3 nm or silicon oxynitride (SiON) film, and a polysilicon (Poly-Si) film having a film thickness of from 3 nm to 8 nm are stacked. A metal such as ruthenium (Ru) may be added to the polysilicon film. The memory cell includes an insulating film on a charge storage film. For example, the insulating film includes a silicon oxide ($SiO_2$) film having a film thickness of from 4 nm to 10 nm which is interposed between a lower High-k film having a film thickness of from 3 nm to 10 nm and an upper High-k film having a film thickness of from 3 nm to 10 nm. Examples of a material of the High-k film include hafnium oxide (HfO) and the like. In addition, the film thickness of the silicon oxide film can be larger than the film thickness of the High-k film. A control electrode having a film thickness of from 30 nm to 70 nm is provided on the insulating film through a film which has a film thickness of from 3 nm to 10 nm. Here, such a film is a metal oxide film such as tantalum oxide (TaO), a metal nitride film such as tantalum nitride (TaN), or the like. Tungsten (W) or the like can be used for the control electrode. An air gap can be arranged between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   first, second, and third memory cells, each of which includes a charge storage layer;
   a first bit line that is connected to the first memory cell;
   a second bit line that is connected to the second memory cell;
   a third bit line that is connected to the third memory cell;
   a first sense amplifier that applies a voltage to the first bit line;
   a second sense amplifier that applies the voltage to the second bit line; and
   a third sense amplifier that applies the voltage to the third bit line, wherein
   a writing operation includes multiple loops of a programming operation and a verification operation, and
   in one of the loops of the writing operation, during a programming operation, using the first sense amplifier, a first voltage is applied to the first bit line, using the second sense amplifier, a second voltage lower than the first voltage is applied to the second bit line, and using the third sense amplifier, a third voltage lower than the first voltage and higher than the second voltage is applied to the third bit line, wherein
   the second voltage is applied by the second sense amplifier to the second bit line in a first loop of the writing operation,
   the third voltage is applied by the second sense amplifier to the second bit line in a second loop of the writing operation to be executed before the first loop, and
   the first voltage is applied by the second sense amplifier to the second bit line in a third loop of the writing operation to be executed after the first loop.

2. The device according to claim 1, wherein
   the first voltage is applied by the sense amplifier to the second bit line in a plurality of consecutive loops of the writing operation to be executed before the first loop.

3. The device according to claim 1, wherein the first loop is a loop of the writing operation occurring directly after verification that data written in the second memory cell has passed.

4. The device according to claim 3, wherein
   the third voltage is applied by the sense amplifier to the second bit line in a plurality of consecutive loops of the writing operation to be executed after the first loop.

5. The device according to claim 1, wherein the first, second, and third memory cells are configured to store multi-bit data.

6. The device according to claim 5, wherein target threshold voltages of programming operations remain the same or increase with each successive loop of the writing operation.

* * * * *